(12) United States Patent
Edwards

(10) Patent No.: US 12,709,494 B2
(45) Date of Patent: Aug. 18, 2026

(54) ELECTROMAGNETIC PCB CROSSROADS TOPOLOGIES FOR AUTOMATION TRACK SYSTEMS

(71) Applicant: Siemens Healthcare Diagnostics Inc., Tarrytown, NY (US)

(72) Inventor: Mark Edwards, Armonk, NY (US)

(73) Assignee: Siemens Healthcare Diagnostics Inc., Tarrytown, NY (US)

( * ) Notice: Subject to any disclaimer, the term of this patent is extended or adjusted under 35 U.S.C. 154(b) by 232 days.

(21) Appl. No.: 18/707,560

(22) PCT Filed: Nov. 4, 2022

(86) PCT No.: PCT/US2022/079322
§ 371 (c)(1),
(2) Date: May 3, 2024

(87) PCT Pub. No.: WO2023/081838
PCT Pub. Date: May 11, 2023

(65) Prior Publication Data

US 2024/0425304 A1 Dec. 26, 2024

Related U.S. Application Data

(60) Provisional application No. 63/276,443, filed on Nov. 5, 2021.

(51) Int. Cl.
*B65G 47/92* (2006.01)
*H01F 27/28* (2006.01)
*H05K 1/16* (2006.01)

(52) U.S. Cl.
CPC ......... *B65G 47/92* (2013.01); *H01F 27/2804* (2013.01); *H05K 1/165* (2013.01);
(Continued)

(58) Field of Classification Search
CPC ............ B65G 47/92; B65G 2201/0235; G01N 35/04; G01N 2035/00762;
(Continued)

(56) References Cited

U.S. PATENT DOCUMENTS 4,313,152 A * 1/1982 Vranken ............ H01F 17/0006 336/200
5,061,891 A 10/1991 Totsuka et al.
(Continued)

FOREIGN PATENT DOCUMENTS

DE 10 2017 212808 A1 1/2019
EP 0 013 782 A1 8/1980
(Continued)

OTHER PUBLICATIONS

Machine translation of Ding et al. International Patent Document WO 2020/155830 A1 Aug. 2020 (Year: 2020).*
(Continued)

*Primary Examiner* — Kevin J Comber

(57) ABSTRACT

A vessel transport system in a liquid handler system includes vessel movers that transport a sample vessel using a magnetic base. A track provides a selective magnetic field to propel the magnetic base of each vessel mover along the track using a plurality of multilayer printed circuit boards (PCB) arranged along a transport path. Each PCB has a plurality of multi-layer conductive coils within layers of the PCB and each coil has a plurality of single-layer spirals electrically coupled with one another to form a multilayer coil. A processor is configured to control selective application of currents to the plurality of multi-layer coils to create the selective magnetic field. At least a subset of the multilayer conductive coils are stacked relative to one another
(Continued)

below a surface of the track, such that the selective application of currents selects one of a plurality of branching paths along the track.

16 Claims, 21 Drawing Sheets

(52) U.S. Cl.
CPC ................ *B65G 2201/0235* (2013.01); *H01F 2027/2809* (2013.01)

(58) Field of Classification Search
CPC ..... G01N 2035/047; G01N 2035/0477; G01N 2035/0493; H01F 5/003; H01F 27/2804; H01F 2027/2809; H02K 3/26; H02K 41/31; H02K 2201/18; H02K 2211/03; H05K 1/165
USPC .......................................................... 361/139
See application file for complete search history.

(56) References Cited

U.S. PATENT DOCUMENTS

| | | | | |
|---|---|---|---|---|
| 9,346,371 | B2 * | 5/2016 | King | B60L 13/10 |
| 2012/0206132 | A1 * | 8/2012 | Lepage | G01N 27/9006<br>324/239 |
| 2018/0269756 | A1 * | 9/2018 | Glöss | H02K 7/14 |
| 2019/0277869 | A1 * | 9/2019 | Stein | G01N 35/026 |
| 2020/0091805 | A1 * | 3/2020 | Kegeler | H02K 21/24 |
| 2020/0168393 | A1 * | 5/2020 | Long | H01F 27/402 |

FOREIGN PATENT DOCUMENTS

| | | | | |
|---|---|---|---|---|
| WO | 2017/080554 A1 | | 5/2017 | |
| WO | 2017/104309 A1 | | 6/2017 | |
| WO | 2018/017770 A1 | | 1/2018 | |
| WO | 2018/171822 A1 | | 9/2018 | |
| WO | 2019/188287 A1 | | 10/2019 | |
| WO | WO-2020155830 A1 | * | 8/2020 | H02K 41/00 |
| WO | 2020/233753 A1 | | 11/2020 | |
| WO | 2024/044517 A2 | | 2/2024 | |

OTHER PUBLICATIONS

Extended EP Search Report dated Feb. 20, 2025 of corresponding European Application No. 22891108.7, 5 Pages.

PCT International Search Report and Written Opinion dated Mar. 16, 2023 (11 Pages).

* cited by examiner 330
326
328
202

ELECTROMAGNETIC PCB CROSSROADS TOPOLOGIES FOR AUTOMATION TRACK SYSTEMS

CROSS REFERENCE TO RELATED APPLICATION

This application claims the benefit of U.S. Provisional Patent Application No. 63/276,443, entitled "ELECTROMAGNETIC PMLSM PCB ACTUATOR TOPOLOGIES FOR AUTOMATION TRACK SYSTEMS" filed Nov. 5, 2021, the disclosure of which is hereby incorporated by reference in its entirety for all purposes.

BACKGROUND

Liquid handlers are robotic systems that are designed to dispense and process selected quantities of reagents, samples, or other liquids. Some liquid handlers are additionally adapted to analyze samples using, for example, immunoassay and/or clinical chemistry techniques. Such types of liquid handlers could be referred to as "analyzers" or "analyzer systems." Some liquid handlers can include a number of modules (also referred to as stations) and a transport system to move samples between the various modules. It is highly desirable for the liquid handler transport systems to move the sample containers in a smooth manner, avoid causing the sample containers to collide with each other and, otherwise prevent liquids from spilling from their containers during transport. In particular, liquid spills waste reagents and/or samples (which could potentially impact the integrity of any tests being performed) and if the spill occurs on the track, it can also create obstructions that could negatively impair the movement of subsequent sample containers.

Liquid handlers are often used in in vitro diagnostics (IVD) applications. IVD allows labs to assist in the diagnosis of disease based on assays performed on patient fluid samples. IVD includes various types of analytical tests and assays related to patient diagnosis and therapy that can be performed by analysis of a liquid sample taken from a patient's bodily fluids, or abscesses. These assays are typically conducted with automated clinical chemistry analyzers onto which fluid containers, such as tubes or vials, containing patient samples have been loaded. The analyzer extracts a liquid sample from the vial and combines the sample with various reagents in special reaction cuvettes or tubes (referred to, generally, as reaction vessels). In some conventional systems, a modular approach is used for analyzers. A lab automation system can shuttle samples between one sample processing module (module) and another module. Modules may include one or more stations, including sample handling stations and analyzer modules/testing stations (e.g., a unit that can specialize in certain types of assays), or can otherwise provide testing services to the larger analyzer, which may include immunoassay (IA) and clinical chemistry (CC) stations, or any other element in the IVD process flow, such as centrifuges, decappers, refrigerated storage, sealers/de-sealers, and sample integrity stations. Some traditional IVD automation track systems comprise systems that are designed to transport samples from one fully independent module to another standalone module. This allows different types of tests to be specialized in two different stations/modules or allows two redundant stations to be linked to increase the volume of sample throughput available. These lab automation systems, however, are often bottlenecks in multi-station analyzers. Relatively speaking, traditional lab automation systems lack large degrees of intelligence or autonomy to allow samples to independently move between stations. Moreover, lab automation systems can be expensive due to their size and complexity.

Conventional liquid handler systems track vessel movers and the liquid samples carried thereby throughout the track systems interconnecting the modules using mechanical conveyor systems (e.g., belts). Recently, there has been some development using coils embedded in the track surface to propel one or more magnets in the base of a vessel mover, the coils and the magnet in the vessel mover together forming a linear synchronous motor (LSM). In an LSM, coils in the track are selectively activated to selectively apply a magnetic field to magnets in the vessel movers, synchronizing the fields to the movement of the magnets, causing movement along a plane. Conventionally, the coils are made of narrow-gauge wound copper wire. This approach is simple to construct, but is expensive, especially as the number of coils goes up to accommodate a large number of paths and the overall size of a laboratory automation system. Furthermore, drive circuits are needed for the coils and Hall effect sensors need to be placed near the track surface to detect the movement of magnets. The circuits are constructed on a printed circuit board (PCB), which may need to be separate from a substrate of the wire windings of the coils, requiring additional mounting, increasing cost and complexity.

Coils made from coiling wires in a LSM are comparatively thick relative PCB components, preventing them from being stacked. This means that custom coil shapes are often used at intersections in the automation tracks, as coils for diverging paths must be placed side by side in the plane of the surface such that magnetic fields are not uniform for the different coil shapes. Exemplary prior art coil geometries are shown in FIG. 1, including wound coil bobbins of varying sizes and arrangements.

For example, as shown in FIG. 1, a linear arrangement of parallel oval coils allows the creation of a straight section of an LSM track, while adjacent oval coils arranged in a curved relationship allows a curved section of LSM track. Synchronous activation of coils creates a moving magnetic field that moves to/from adjacent coils along the row of coils. While this arrangement allows wound-coils to effectively propel a magnet in a linear direction or a curved direction, the fields generated by coils become harder to manage and less uniform when the track branches, such as in track section 2. Track section is a control board onto which two groups of coils are mounted and potted, a straight group of coils 4 and a curved group of coils 6. By synchronously activating these groups of coils, a magnet in the base of a vessel mover/carrier can be selectively propelled along the chosen path. However, as can be seen in straight coil group 4, the coils nearest the intersection of the coil groups are smaller, which can limit the force applied to the magnets on the track, often requiring a mechanically-switchable guide to assist the diversion of the linear path. This is because the coils are quite thick relative to the width of the coils, so wound coils cannot be easily stacked. Stacking wound coils would move the top face of the bottom coil away from the track surface, causing a non-uniform diverging magnetic field at the track surface and reduce coupling efficiency.

Accordingly there is a need for improved coil construction beyond the existing wound coils that mounted and potted to control boards along the track of an LSM mover system.

SUMMARY

Described herein are systems and methods for tracking vessel movers in a liquid handler system and/or the liquid samples carried thereby using sparse sensor assemblies.

In one embodiment, the present disclosure is directed to a transport track for selectively routing magnetic vessel movers comprising a plurality of multilayer printed circuit boards (PCB) arranged adjacent to one another such that a surface of each PCB provides a track surface along which the magnetic vessel movers ride and a plurality of conductive coils, each coil being formed within one of the PCBs and comprising a plurality of single-layer spirals electrically coupled in a stack with one another to form a multilayer coil. A processor is configured to control selective application of currents to the plurality of multi-layer coils to create a magnetic field to propel the one or more magnetic vessel movers along the track. The plurality of conductive coils are arranged adjacent to one another in each PCB to create at least one continuous path for the magnetic vessel movers to move along.

In some embodiments, each of the plurality of conductive coils have a long axis and a short axis, and an edge of each coil intersected by the short axis is substantially parallel with an edge of each adjacent coil. In some embodiments, the processor is configured to control selective application of the currents in accordance with a predetermined motion profile that sets at least one of maximum acceleration and maximum velocity to limit vessel spilling. In some embodiments, each of the plurality of conductive coils comprises at least twelve single-layer spirals, and each spiral comprises at least twelve turns. In some embodiments, each PCB has a low-friction coating on a surface along which vessel movers travel. In some embodiments, each PCB has a plurality of Hall effect sensors mounted thereto that are configured to monitor motion of the magnetic vessel movers along the at least one continuous path. In some embodiments, at least a subset of the plurality of conductive coils are stacked within at least one of the PCBs such that the stacked conductive coils form an intersection in the at least one continuous path.

In one embodiment, the present disclosure is directed to a vessel transport system in a liquid handler system comprising one or more vessel movers configured to transport a sample vessel and having a magnetic base and a track configured to provide a selective magnetic field to propel the magnetic base of each vessel mover, the track comprising a plurality of multilayer printed circuit boards (PCB) arranged along a transport path, each PCB having a plurality of multi-layer conductive coils within layers of the PCB, each coil comprising a plurality of single-layer spirals electrically coupled with one another to form a multilayer coil. A processor is configured to control selective application of currents to the plurality of multi-layer coils to create the selective magnetic field to propel the one or more vessel movers along the track.

In one embodiment, the present disclosure is directed to a printed circuit board (PCB) comprising top face, a plurality of alternating dielectric and conductive layers beneath the top face, a plurality of multilayer conductive coils in the alternating dielectric and conductive layers (each coil comprising a plurality of spirals formed in a plurality of the conductive layers and an electrical connection between each adjacent spiral to form a stack of spirals), and a first and second directional group of coils. Each group comprises a subset of the multilayer conductive coils, forming a first and second path of horizontally adjacent coils, respectively. Each path provides a different direction of possible motion for a magnet motivated along the top face. At least some of the multilayer conductive coils of the first and second directional group of coils overlap under the top surface, forming an intersection of the first and second paths. The plurality of multilayer conductive coils are configured to receive processor-controlled currents to create a moving magnetic field to selectively propel the magnet along the first and second path.

In some embodiments, the first and second paths are perpendicular at the intersection. In some embodiments, the first path proceeds substantially straight through the intersection while the second path turns in an arc through the intersection. In some embodiments, the first and second directional group of coils overlap under the top surface by forming coils from the first group of coils using spirals on different layers than the spirals of the second group of coils such that the coils of the first group are between the top face and the coils of the second group. In some embodiments, the first and second directional group of coils overlap under the top surface by forming coils from the first group of coils using spirals on different layers than the spirals of the second group of coils such that the spirals of the coils of the first group and the second group are interleaved.

In one embodiment, the present disclosure is directed to a vessel transport system in a liquid handler system comprising one or more vessel movers configured to transport a sample vessel and having a magnetic base and a track configured to provide a selective magnetic field to propel the magnetic base of each vessel mover along the track (where the track comprises a plurality of multilayer printed circuit boards (PCB) arranged along a transport path and each PCB having a plurality of multi-layer conductive coils within layers of the PCB and each coil comprises a plurality of single-layer spirals electrically coupled with one another to form a multilayer coil. A processor is configured to control selective application of currents to the plurality of multi-layer coils to create the selective magnetic field. At least a subset of the plurality of multi-layer conductive coils are stacked relative to one another below a surface of the track, such that the selective application of currents selects one of a plurality of branching paths along the track.

BRIEF DESCRIPTION OF THE DRAWINGS

The accompanying drawings, which are incorporated in and form a part of the specification, illustrate the embodiments of the invention and together with the written description serve to explain the principles, characteristics, and features of the invention. In the drawings.

DETAILED DESCRIPTION

Figure 1:
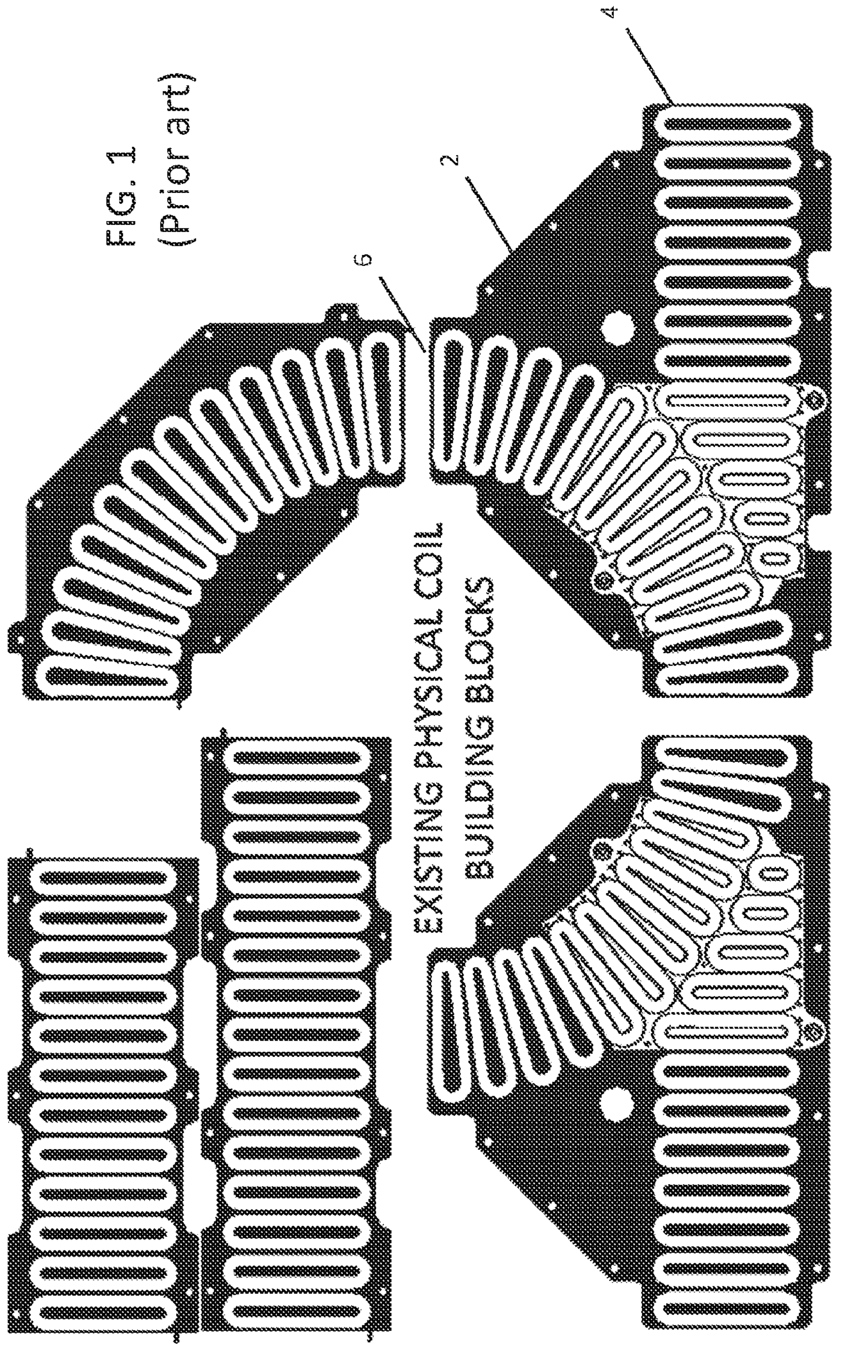
FIG. 1 is a top view of prior art wound coil tracks.

This disclosure is not limited to the particular systems, devices and methods described, as these may vary. The terminology used in the description is for the purpose of describing the particular versions or embodiments only, and is not intended to limit the scope.

As used herein, the terms "algorithm," "system," "module," "engine," or "architecture," if used herein, are not intended to be limiting of any particular implementation for accomplishing and/or performing the actions, steps, processes, etc., attributable to and/or performed thereby. An algorithm, system, module, engine, and/or architecture may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular algorithm, system, module, and/or engine is, unless otherwise specified, for purposes of convenience of reference and not intended to be limiting to a specific implementation. Additionally, any functionality attributed to an algorithm, system, module, engine, and/or architecture may be equally performed by multiple algorithms, systems, modules, engines, and/or architectures incorporated into and/or combined with the functionality of another algorithm, system, module, engine, and/or architecture of the same or different type, or distributed across one or more algorithms, systems, modules, engines, and/or architectures of various configurations.

Automated Liquid Handler Systems

A liquid handler or liquid handling robot system that is designed to dispense and process any type of liquid, including reagents and patient samples. Liquid handlers are particularly adapted to automate workflows in life science laboratories, such as clinical laboratories or research laboratories. Some liquid handlers, which can be referred to as "analyzers" or "analyzer systems" are additionally adapted to process and perform tests on samples using, for example, immunoassay and/or clinical chemistry techniques.

Liquid handlers can include automation systems, either integrally or as modules coupled to the liquid handlers. Some liquid handler systems can include a number of modules or stations that are adapted to perform different tasks or tests. In these embodiments, the automation systems can include a transport system that is adapted to transport containers of samples and/or reagents between the various modules or stations. As noted above, transport systems can include friction-based movement systems, conveyor belts, and magnetically driven movement systems. Automation systems can further include sensor assemblies for detecting parameters associated with the containers or other aspects of the transport systems and control systems that are configured to control the movement of the containers accordingly.

In some embodiments, liquid handler systems can utilize a modular system including an automated clinical chemistry analyzer module and an automated immunoassay analyzer module, with sample loading capability to transport patient samples to and from analyzer module(s) where in vitro diagnostic assay analyses are performed. The system can be scalable in multiple configurations of the modules allowing customer yearly throughput needs ranging from low volume to very high volume/mega market segments (i.e., 500,000 to 5M or more tests per year).

In some embodiments, the automation system can be described as a process control manager (PCM) that manages the processing of samples. This includes providing input and output for samples into and out of the system, temporary storage of samples while awaiting processing, scheduling of samples for processing at various analyzers attached to the PCM, facilitation of the movement of samples throughout an automation track (including onto and off of the automation track), and, in some embodiments, maintenance of the automation systems. In various embodiments, a PCM can include a variety of different modules, including a sampler handler and a vessel mover.

The sample handler provides a means for the user to load and unload regular samples, STAT samples, and control/calibrator vials onto and off of the system. Within the sample handler, the robot subsystem is responsible for moving these tubes between other subsystems and modules, including the sample I/O (drawer trays), control storage, and the vessel mover.

The vessel mover subsystem handles this material distribution. Under normal conditions, a lab technician never operates the vessel mover track directly. The vessel mover manages carriers on an automation track that moves samples or reagents, each carrier having a dedicated type of holders. In some embodiments, liquid handler systems can include reagent carriers that are configured to accept a reagent cartridge and to transport the reagent cartridge, via the automation track, to a location accessible to the one or more analyzer modules. In some embodiments, a reagent carrier can be adapted to handle reagents from both an immunoassay module and clinical chemistry module.

Figures 2A, 2B:
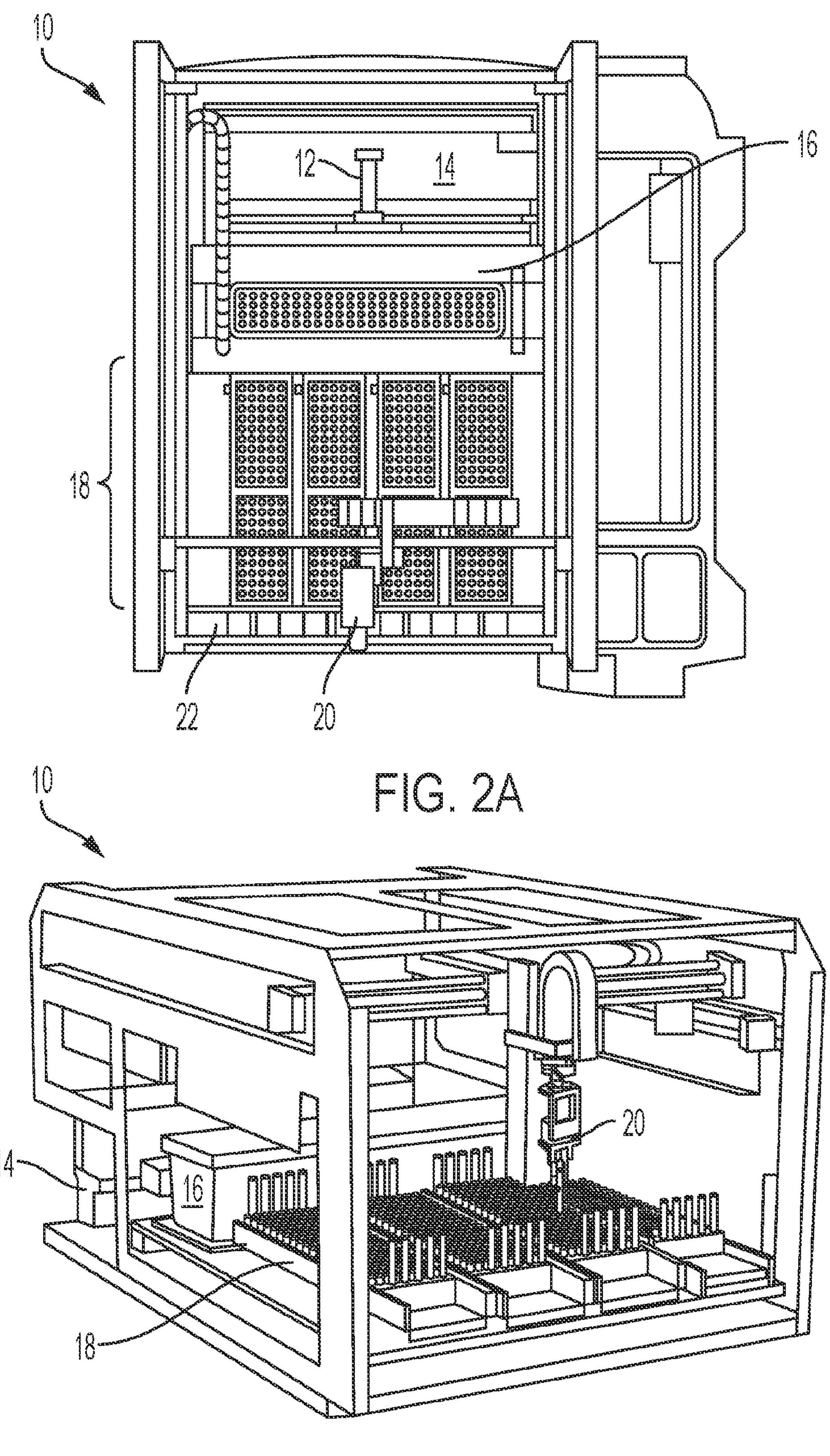
FIG. 2A is a top down view of an exemplary sample handling module, in accordance with at least one aspect of the present disclosure.
FIG. 2B is a perspective view of an exemplary sample handling module in accordance with at least one aspect of the present disclosure.

FIG. 2A shows a top-down view of an exemplary sample handler 10 that may be used for some embodiments. Within this figure, sample handler 10 is oriented so that the front (i.e., the face that the operator interacts with) is at the bottom of the page, while the back of the automation track is located at the top of the page. Sample handler 10 includes a tube characterization station 12 at the robot/track interface. Tube characterization station 12 characterizes tubes and carriers when tubes are placed on carriers on track 14. This allows information to be ascertained about the identity of the tube placed in each carrier, and the physical condition of each tube (e.g., size of the tube, fluid level, whether there is a tube top cup, etc.) Adjacent to the tube characterization station 12 sits a control/calibrator storage region 14. This allows long-term refrigerated storage of control and calibrator fluids near the track, allowing these fluids to be easily placed into carriers on the track for movement to relevant locations in the analyzer. The location of storage 16 also allows input/output drawers 18 to be placed in the front of sample handler 10. In this example, there are four adjacent drawers 18 that can be individually opened and pulled out.

A robot arm 20 can move in two dimensions to pick up any of the tubes in drawers 18 and move those tubes to and from storage 16 and carriers on track 14. Robot arm 20 can be positioned by moving a gantry from the front to the back of a sample handler 10 while a carriage moves side to side along that gantry. Opposable end effectors can then be moved vertically to reach down to pick up tubes, closing the end effectors when they are properly positioned to engage the tube.

To assist the robot arm 20 in successfully engaging each tube, a drawer vision system 22 is placed above the drawers at the opening to the drawers. This allows a series of images to be taken, looking down at the tubes in the trays, as the trays are moved past the drawer vision system. By strobing a series of cameras, multiple images can be captured in a buffer, where each tube appears in multiple images. These images can then be analyzed to determine the physical characteristics of each tube. For example, diameters and heights of each tube can be determined. Similarly, the capped or uncapped states of each sample can be quickly determined. Furthermore, the presence or absence of a tube top cup (a small plastic well that is placed on top of a tube to allow a tube to transport a much smaller volume with greater depth of the sample, to allow aspiration to more easily take place) can be ascertained. Similarly, the characteristics of any cap can be ascertained by the images. This can include certain color markings on the cap to identify a given sample as a higher priority (STAT) sample.

The module manager PC can utilize this information to schedule samples to be moved from each tray in drawers 18 into carriers on track 14. The module manager PC can also instruct robot arm 20 how to interact with each tube, including identifying the proper height for the end effectors before engagement, and the proper force or distance to use when engaging the end effectors to accommodate multiple diameters of tubes.

FIG. 2B is a perspective view of a sample handler 10. In this example, track 14 is roughly parallel with the front face of drawers 18, while refrigerated storage 16 is a large physical object between drawers 18 and track 14. Meanwhile, robot arm 20 is moved on supports, well above the height of drawers 18 and refrigerated storage 16. In some embodiments, the sample handler 10 can include a tube characterization station 12 and a drawer vision system 22; however, these stations are omitted from the view in FIG. 2 in order to allow the internals of sample handler 10 to be better understood.

Figure 3:
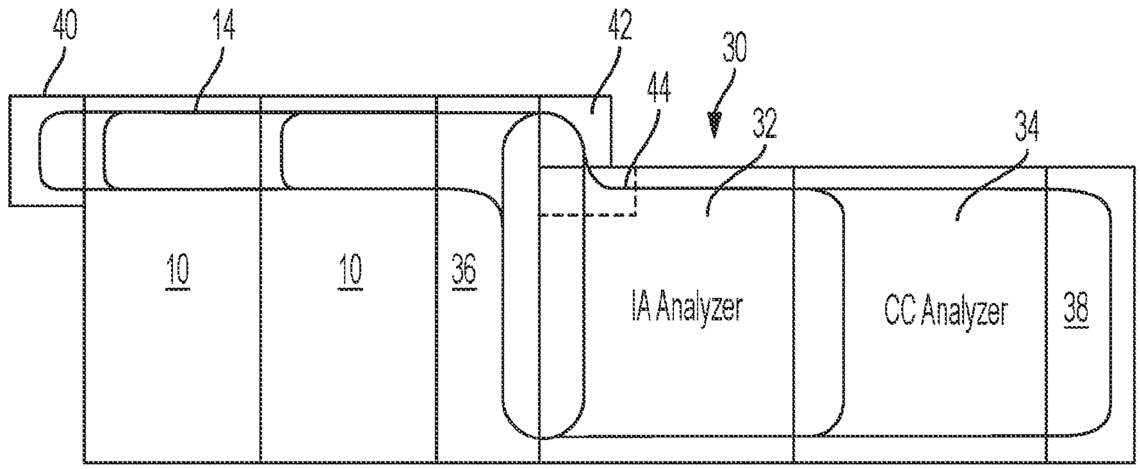
FIG. 3 is a diagrammatic view of an exemplary integral, modular automation track system, in accordance with at least one aspect of the present disclosure.

FIG. 3 illustrates the vessel mover components of the PCM that moves samples from an input region to analyzer modules, assists in handling those samples within the analyzer, and returns process samples to the output region of the sample handler. Multi module analyzer system 30 includes multiple interconnected modules. In this example, system 30 includes multiple sample handlers 10. By utilizing multiple sample handlers, more sample trays can be placed into the system, allowing a larger batch to be started at the beginning of the shift. Furthermore, this allows twice as many samples to be placed onto, and taken off of, the track. This means that, for larger systems with multiple analyzer modules that can operate in parallel, input/output throughput can match the analysis throughput of the parallel analyzers. For example, if an analyzer module can handle 500 samples per hour, and three analyzer modules are used, the input/output demand for feeding these modules may be up to 1500 samples per hour. In some embodiments, a single sample handler may not be able to handle this demand, necessitating adding multiple sample handlers to keep up with the input/output demand of the analyzer modules.

Furthermore, in some embodiments, one of the sample handlers can be set up to be used as an input, while the other sample handler can be set up as an output. By using a modular approach, a single sample handler 10 can be used but, for larger systems, two or more sample handlers can be used.

In an exemplary system 30, two analyzer modules are utilized. Analyzer module 32 is an immunoassay (IA) analyzer. Analyzer module 34 is a clinical chemistry (CC) analyzer. These two analyzer modules perform different assays, testing for different characteristics of patient samples.

Track 14 is a multi-branching track that forms the heart of the vessel mover system. As can be seen, track 14 comprises branches and lengths that are provided integral to sample handlers 10 and analyzer modules of 32 and 34. The functions of the individual branches will be explained with respect to FIGS. 5 and 6. In addition to the track segments provided by these modules, additional modules 38, 40, and 42 provide short, dedicated track sections that may be bolted to the track portions provided by the other modules. Track modules 36, 38, 40, and 42 provide powered track segments, without additional hardware related to sample handler modules or analyzer modules. Whereas modules 10, 32, and 34 may be full cabinets extending from a laboratory floor to the height of track 14, and above, track segment modules 36, 38, 40, and 42 may be bolt-on segments that extend from the cabinets of the other modules, without requiring floor-length support. Each of the modules in FIG. 3 can be bolted together in modular fashion, utilizing leveling hardware, such that each track segment between adjacent modules forms a virtually seamless track for carriers to traverse the vessel mover system.

In exemplary system 30, it can be seen that section 44 of the track of analyzer module 32 may need to be altered from the corresponding section of analyzer module 34. In some embodiments, the track segments of analyzer modules are in the same configuration as that shown in analyzer module 34 when they are shipped from the factory. This allows multiple analyzers to be placed in series, simply bolting their respective track segments together to form a long chain. In some embodiments, where there is an offset between the back track segment of the sample handler modules and the analyzer modules, as is illustrated in system 30, an S-shaped bend may be needed to allow carriers to move from the back track section of analyzer modules to the back track section of the sample handler modules. In this example, this S-shaped bend is provided by bolting on track section 42 and the altered track segment in area 44. Thus, it should be understood that the track segments within analyzer modules, while integral to those modules, can be extensively modified at the time of installation, allowing multiple configurations of the track segments within an analyzer module. However, it should be understood that these track segments are still very much integral to those analyzer modules. In some embodiments, the back of analyzer modules 32 and 34 are flush with the backs of sample handlers 10, eliminating the need for altering track segment 44 and section 42, entirely.

Track segments 38 and 40 are U-shaped track segments that provide returns between front track segments and back track segments, allowing traffic to move around the track 14 without traversing interior chord segments within sample handler or analyzer modules. This allows the track 14 to form an outer loop, with main traffic moving along the perimeter of the analyzer modules. Meanwhile, the internal track sections bypass the main loop, providing a direct path between two sides of each analyzer module (front to back), which serves as a route for local traffic. These chord segments can also be referred to as internal segments/track sections, bypass segments/track sections, or, in some cases, local track sections. These chord segments bypass the outer loop to provide access to a pipette. This allows small physical queues relevant to each sample handler or analyzer module to utilize those interior chord segments, without blocking the overall flow of track 14.

A specialized track segment module 36 facilitates sample return and branching within track 14 to allow the central computer system of the PCM to direct traffic in flexible ways. The outside track portions provide a way for samples to move from sample handler modules 10 to track segments of analyzer module 32, and vice versa. Meanwhile, the inner chord of track segment module 36 provides a branch whereby samples can move from analyzer 32 to analyzer 34 (in a counterclockwise manner), without moving into sample handler modules 10. This facilitates multiple tests on a single sample tube, allowing sample tubes to freely move between analyzer modules, regardless of how they are arranged on the right-hand side of system 30. This gives the PCM scheduling software flexibility in how samples order the tests within analyzer modules, without increasing traffic on the track segments relating to sample handling. Track segment 36 provides a boundary between sources and sinks (e.g., sample handler modules 10) and processors (e.g., analyzer modules 32 and 34) by providing a branching loop within section 36 (and section 42, in some embodiments). This loop allows sample carriers to move between the sources, sinks, and processors, including allowing samples to loop without returning to the sources and sinks.

Not shown in FIG. 3 is the central computer that includes a system instrument manager software component. The instrument manager software consolidates information from lower-level modules, such as sample handler 10 and analyzer modules 32 and 34, to present this information to an operator. The instrument manager receives information from the other modules via a network within the system (e.g., an internal Ethernet network). Information may be requested and provided asynchronously between the modules and central computer. The central computer can also work between the LIS and vessel mover systems to schedule samples and their movement within the system. The central computer can also work between the vessel mover systems and individual modules to handoff control of the samples and to initiate testing of samples once they arrive at a location.

Additional information regarding in vitro diagnostics systems can be found in U.S. patent application Ser. No. 16/319,306, published as U.S. Patent Application Pub. No. 2019/0277869A1, titled AUTOMATED CLINICAL ANALYZER SYSTEM AND METHOD, filed Jan. 18, 2019, which is hereby incorporated by reference herein in its entirety.

PCB-Based Automation Track Configurations

Various liquid handlers can include a variety of different transport systems, including electro-magnetic drive systems, friction-based track systems, or conveyor belts. For example, some liquid handlers include a track having a plurality of synchronously controlled electro-magnetic coils. The vessel movers in this case typically consist of a permanent magnet array whose field interacts with that generated by the electro-magnet coil array on the track. In these analyzer systems, the automation track is configured to move the sample carriers via synchronously controlled electro-magnetic coils that propel the sample carriers along the analyzer system's track sections. However, conventional electro-magnetically driven transport systems use metallic substrates for the automation track. Metallic substrates have several disadvantages, including cost and weight, as generally discussed above. Accordingly, embodiments of transport systems described herein include PCB-based substrates for the automation track. In these embodiments, each track segment can include one or more PCBs having coil arrays that are configured to electromagnetically actuate the vessel mover to transport the vessel mover therealong.

In some embodiments, track sections are divided up into a number of coil boards. Prior art coil boards includes a linear array of coils that can be mounted to the PCB substrate of the track. In some embodiments, the coils are formed in the copper layers of the PCB itself. For straight sections of track, each coil board is straight, while, in corners or curves, coil boards include appropriately laid out coils to match the curve. In some embodiments coil boards are controlled by master boards and node controllers. In some embodiments, each master board can control up to eight different coil boards. Meanwhile, a node controller is centralized. A single node controller can control the entire vessel mover track. In some embodiments, multiple distributed node controllers can be used for expandability. For example, in larger systems, where the track extends for several meters, multiple node controllers may be used, and control of carriers can be handed off as they traverse different regions of the track network. In some embodiments the components of the master boards can be integrated directly into the coil boards, allowing inclusion of control and drivers and magnetic coils on the same circuit board.

Figure 4:
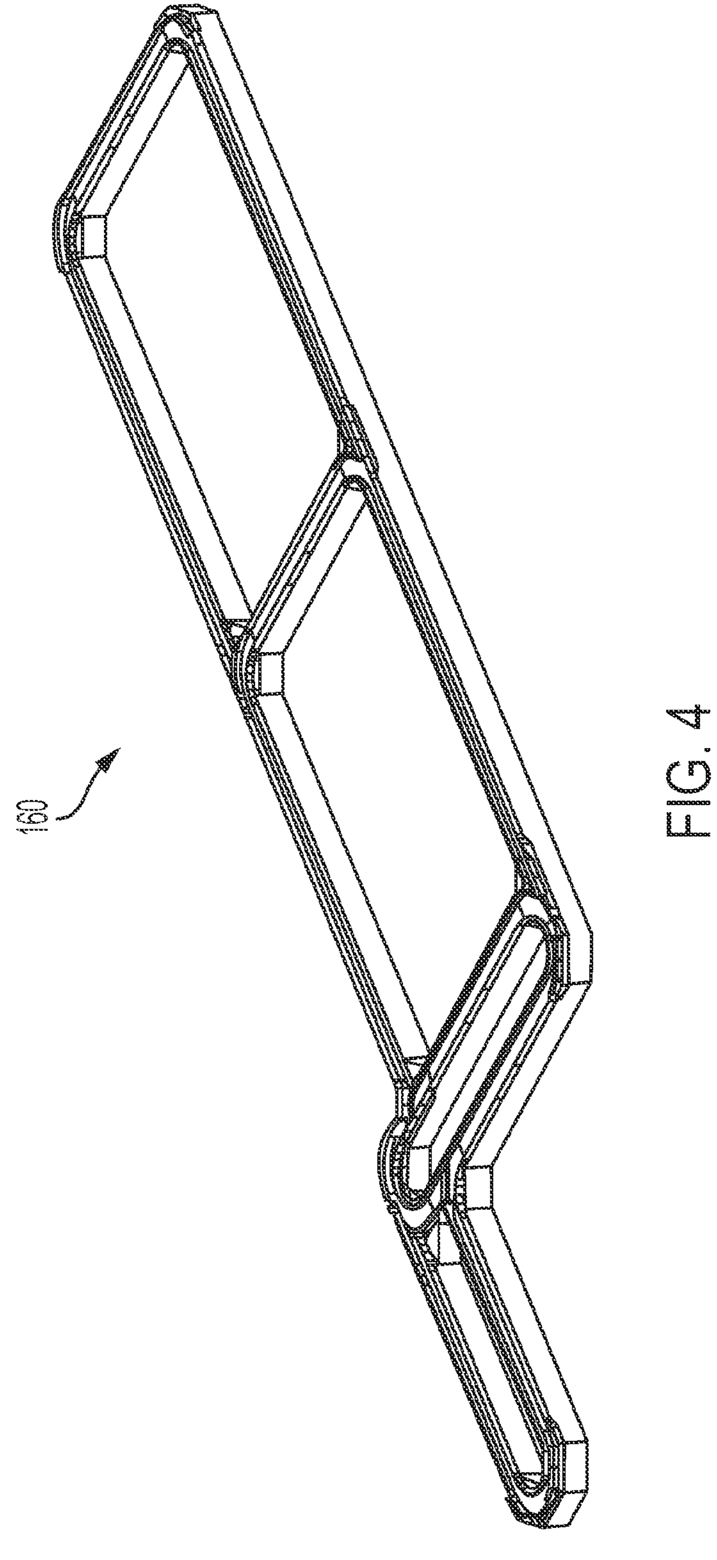
FIG. 4 is a perspective view of an exemplary automation track system, in accordance with at least one aspect of the present disclosure.
Figure 5:
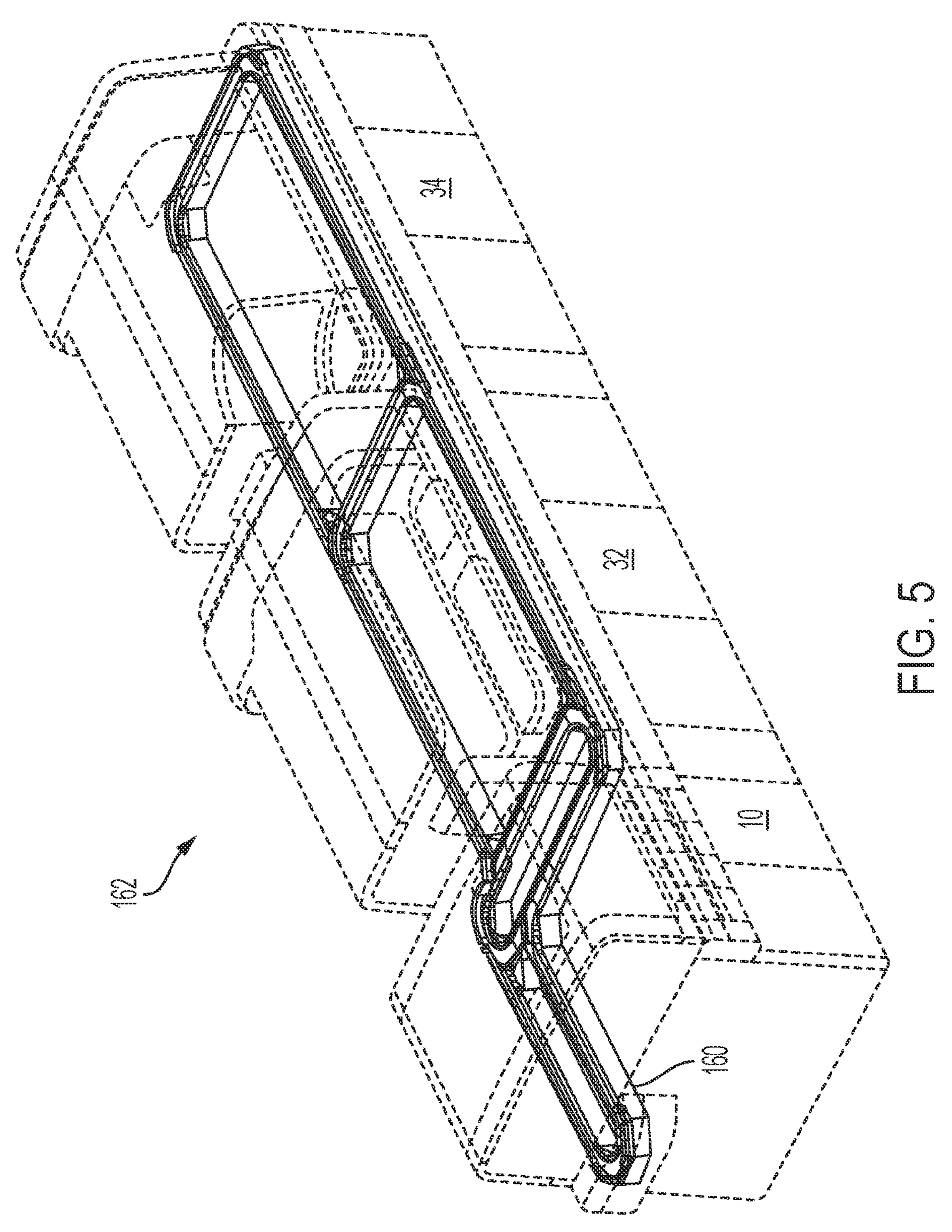
FIG. 5 is a perspective view of an exemplary automation track system, in accordance with at least one aspect of the present disclosure.

FIG. 4 shows a perspective view of track system 160. Track system 160 is configured to have a single sample handler unit and two analyzer modules. FIG. 5 shows track system 160 situated in a fully operational analyzer system 162 that includes a sample handler module 10 and two analyzer modules of 32 and 34. As can be seen, track system 160 is housed within the modules themselves, such that the track is not easily accessible to an operator. However, track 160 and analyzer system 162 utilize a modular design whereby track components reside within each module and each module can easily be linked together to join the track segments by placing adjacent modules in proximity and linking them. Lids above track 160 can be removed during installation or service to facilitate linking of tracks. In some embodiments, track sections are expanded by placing modules adjacent to one another and bolting the track sections of each module together forming a single multi-branching track system, such as track 160. Signaling cables can be daisy-chained together for ease of expanding control.

Figure 6:
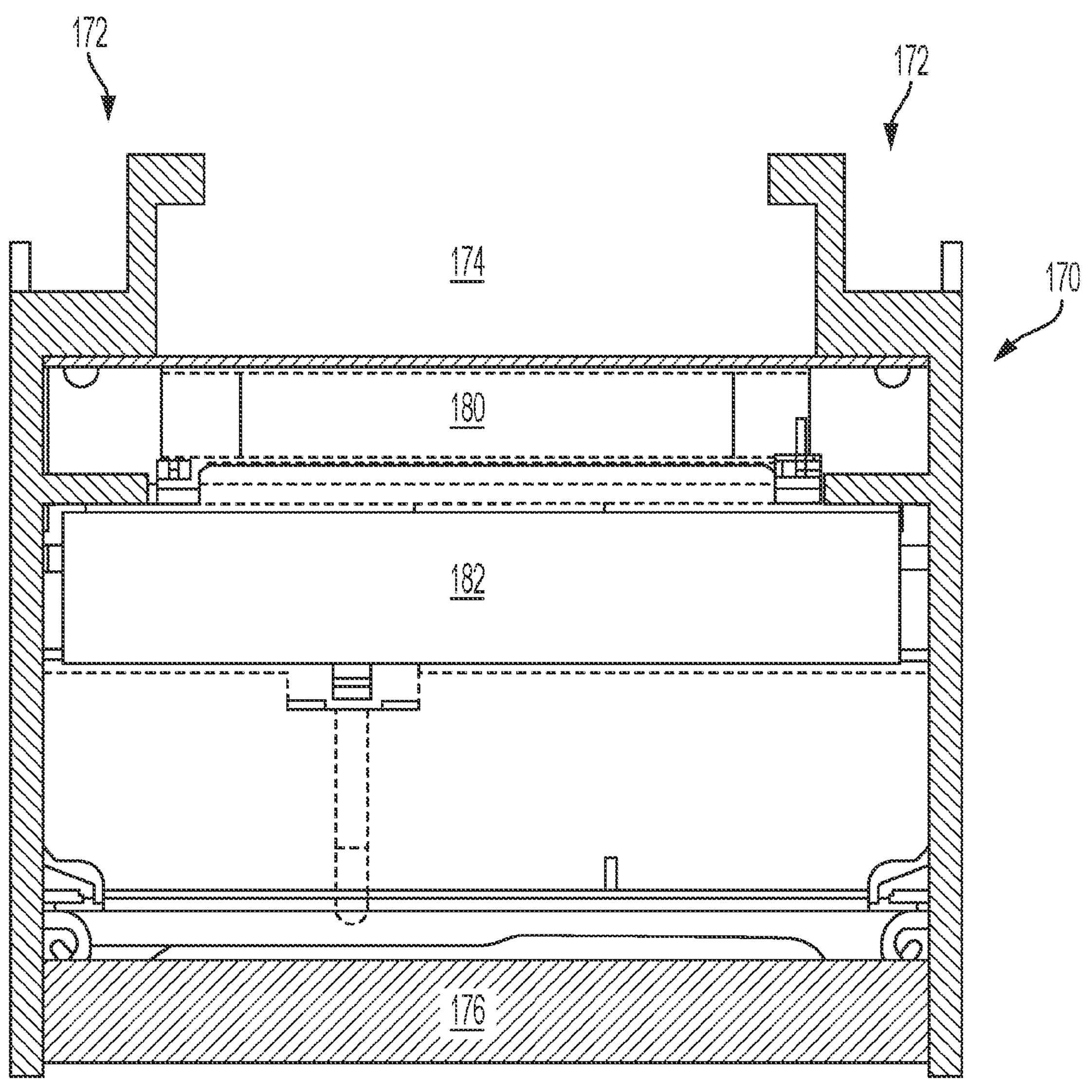
FIG. 6 is a cross sectional view of an exemplary automation track system, in accordance with at least one aspect of the present disclosure.

FIG. 6 shows a cross-sectional view of an embodiment of track section 170. Track section 170 may be track section used in track 160. In this embodiment, carriers ride between rails 172 on a track surface 174. In some embodiments, rails 172 are aluminum extrusions that also include vertical sides on the exterior of the track components underneath track surface 174. These aluminum extrusions can include brackets to easily bolt internal components to these side pieces to form a track unit. In the embodiments described herein, the track surface 174 is a PCB. In various embodiments, the PCB track surface 174 can include one or more coatings or other components. At the bottom of the side components of rails 172 resides a baseplate 176. Baseplate 176 can be mounted to the modules containing track section 170 and provide support for the track system.

Beneath track surface 174 reside a series of coils 180. The longitudinal direction of track section 170 is into the page; as you travel along the track section 170, you encounter additional coils 180. In prior art versions, coils 180 are wound-bobbin coils that are mounted to coil boards 182. They are laterally oblong to allow more coil density in the longitudinal direction of the track. In some embodiments, coil boards 182 are printed circuit boards (PCB) that include several coils 180 in the longitudinal direction. In some embodiments, coils 180 are not wound coils, but are themselves printed in a multi-layer PCB as explained throughout, making coil boards 182 and coils 180 much thinner than they appear in FIG. 6. Furthermore, in some embodiments, coils 180 can be printed directly in the layers of coil boards 182, making boards 182 and coils 180 one monolithic entity, making the combination even thinner. Thus, FIG. 6 is merely illustrative and not intended to necessarily show scale.

An exemplary coil board is 250 mm in length, accommodating all the coils 180 needed for 250 mm of track. Thus, atypical track section will have several coil boards 182, including dozens of coil boards 182 to make up an entire track system. In some embodiments, coil boards 182 receive a control signal to indicate the trajectory to apply to a carrier traveling along that coil board and a power source of 24 VDC. In some embodiments the PCB coil board itself forms the track (riding) surface. Coil boards 182 include coils 180, motor drivers to drive those coils, and one or more sensors to detect the presence of carriers traversing the track surface above the coil board by detecting the magnets of the carrier. These sensors can include Hall Effect sensors to detect the presence and location of the carrier traveling along the coil board. Accordingly, there may be more sensors than coils, allowing fine resolution of the position of a carrier traversing track surface 174. Furthermore, an RFID receiver may be utilized to receive an RFID signal that identifies the carrier traveling along the track surface. In some embodiments, magnetic signatures unique to each carrier can be detected by the Hall Effect sensors to determine the identity of the carrier magnetically. For example, a carrier traversing an array of Hall Effect sensors can be characterized at manufacturing to identify a unique signature of that carrier based on rise times and signal artifacts that are detected by the Hall Effect or sensor array as magnets in the carrier travel over that array. In some embodiments, smaller magnets than the main drive magnets may be placed in the bottom portion of a carrier to intentionally create a unique signature for each carrier at manufacturing. This magnetic signature can be correlated to an identity of each carrier in software for the vessel mover system. An exemplary linear synchronous motor drive system utilizing wound coils is described in U.S. Pat. No. 9,346,371. Embodiments described herein improve upon this exemplary design by utilizing coils created directly within a multi-layer PCB.

Figure 7:
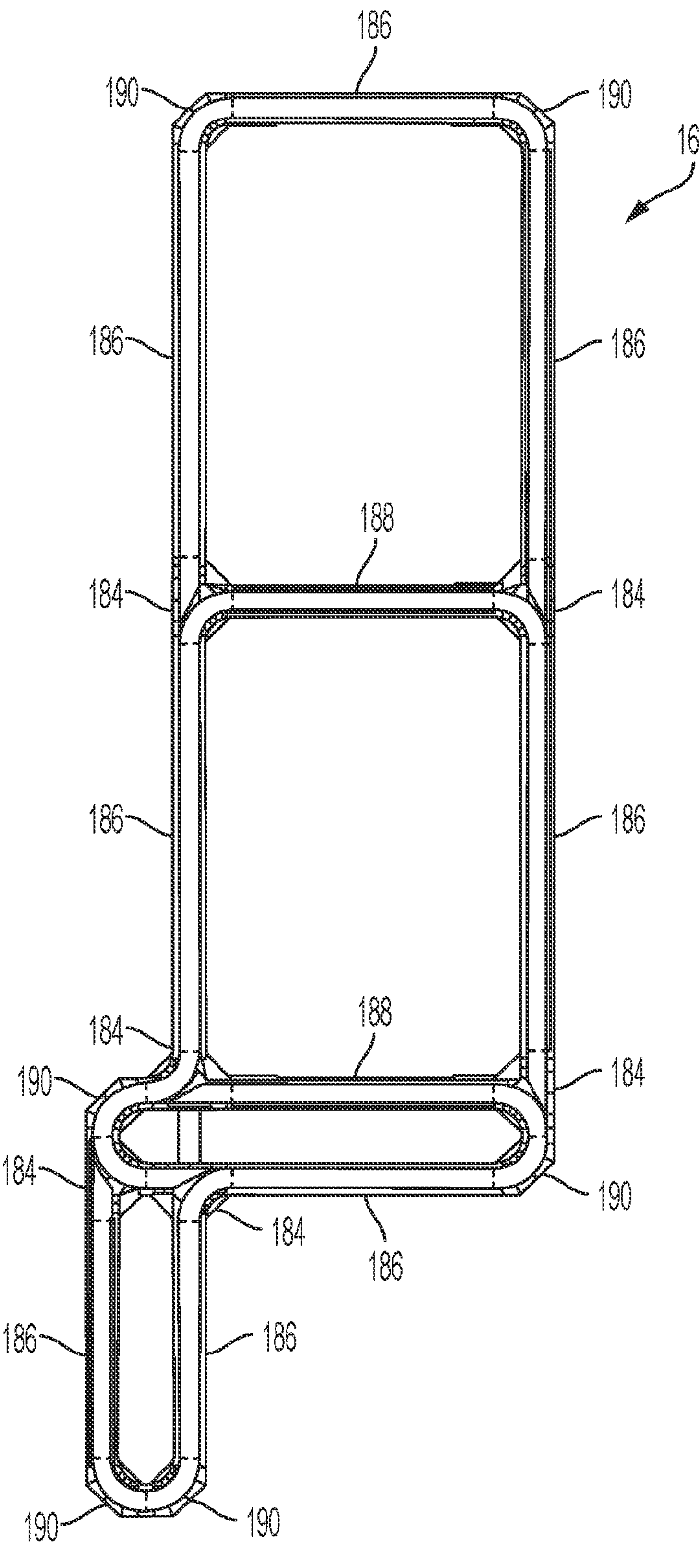
FIG. 7 is a top down view of an exemplary automation track system, in accordance with at least one aspect of the present disclosure.

FIG. 7 shows a top view of an exemplary track system 160 with the individual track sections identified. There are generally four types of track sections that make up the modular design of track system 160. Exemplary prior art versions of these track modules utilizing wound coils are shown in FIG. 1, which illustrate the coil topologies used in the prior art. Each of these track section types can also be created using PCB printed coils, as described herein. Switching segments 184 are an example of branches in the track. The track surface for switching segments 184, in this example is generally T-shaped, with rounded inside edges. In some embodiments, the rails of switching segments 184 include one straight rail (top of the T), one radiused rail (one inside corner of the T), and one radiused rail that includes a switching mechanism (other inside corner of the T). This switching mechanism is a movable rail component that can be turned a predetermined number of degrees to act as a switch (e.g., 20-30 degrees, depending on geometry). On one side of the rail component, it acts as a straight rail. On the other side of the rail component, the rail presents itself as a radiused rail forming an outside corner of a turn. By switching a movable rail component, that movable rail component can either provide the outside of a turn, or a simple straightaway rail. Thus, the mobile component provides a binary switch whereby switching segment 184 presents itself as a turn or as a straightaway, depending on the control signal. This can be used to divert individual carriers based on the state of the switching segment. It should be noted that, while the track may be bidirectional, only one end of the T can be connected to the center portion of the T to form a turn. Thus, while switching segments 184 may have three ports, essentially, one port may be switched to either of the other two ports, but those two ports cannot be joined together.

Figure 14A:
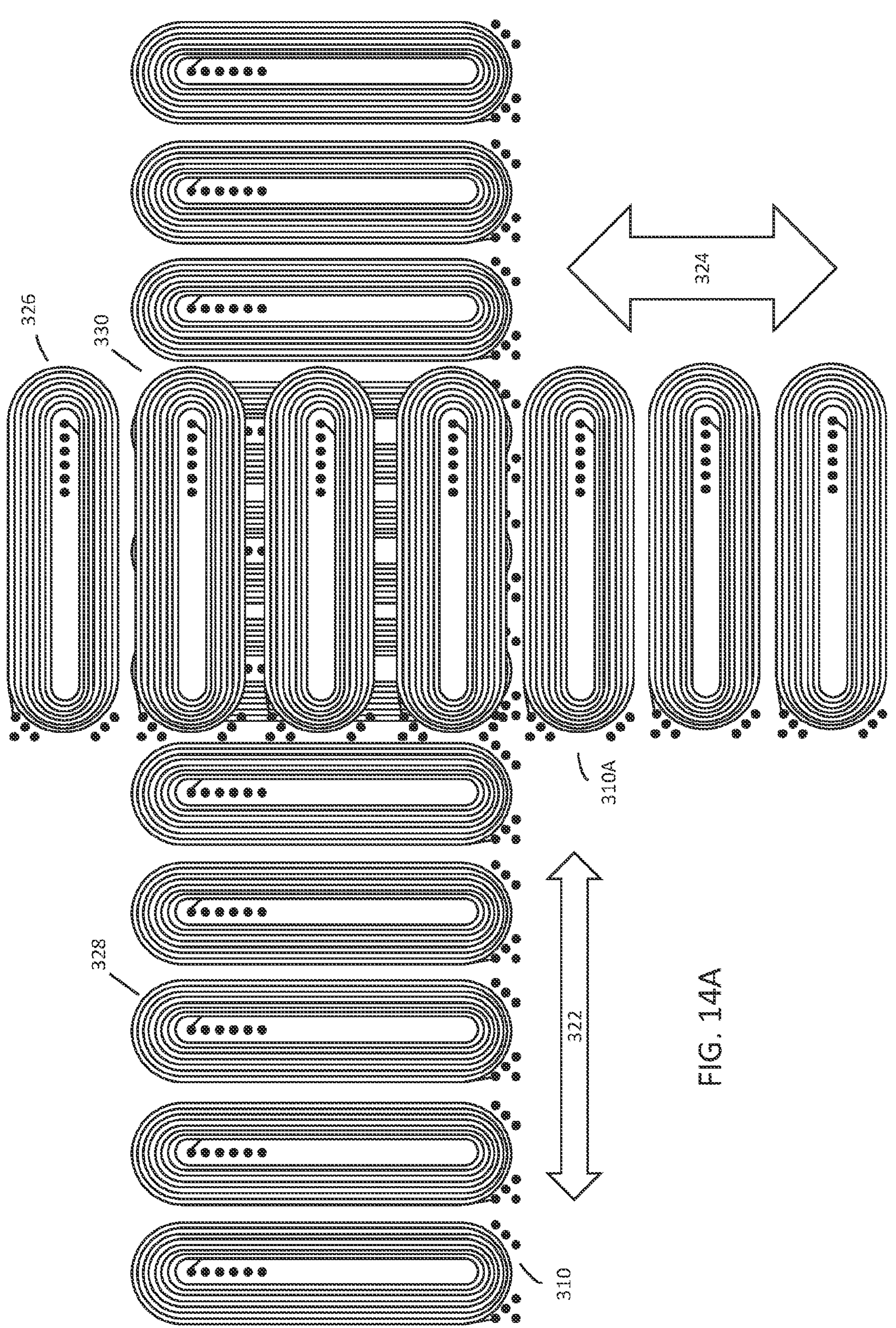
FIG. 14A is a top-view of a PCB coil track intersection in accordance with at least one aspect of the present disclosure.

It should be noted switching segments 184 are limited in this example to T-shaped intersections because they use a coil topology like that shown in track section 2 in FIG. 1, due to the use of wound coils. As explained below, 4-way perpendicular intersections are possible, such as shown in FIG. 14A, when PCB-embedded coils are used because such a design allows for coils to be stacked or interleaved. In some embodiments, 3-way non-perpendicular intersections are achieved using stacked or interleaved PCB-embedded coils.

A simpler type of track section is a straightaway, such as outside straightaway 186 or inside straightaway 188. The basic components of straightaways 186 and 188 are a track surface and rails, with a series of coil boards providing linear motive forces along the direction of that straightaway. Straightaways 186 and 188 are identified separately in FIG. 7 because inside straightaways 188 can be operated under the control of the local module, rather than a vessel mover controller that controls the entire track 160, in some embodiments. This allows each local module to independently operate track sections 188 to act as a local random-access queue. The vessel mover controller can hand off control to the local module after moving a carrier from a switching segment 184 to the local inside straightaway 188. Similarly, when a local module has completed aspirations on a sample residing on inside straightaway 188, that module may move the sample carrier into a switching segment 184 and hand off control to the vessel mover controller. In some embodiments, inside track sections 188 still operate under the control of the vessel mover controller that controls the entire track system 160. To control a local queue on inside straightaway 188, the local module can communicate directly with the vessel mover controller to request movement of carriers within track section 188. This allows the local module to manifest control over carriers in its queue by using a request to acknowledge the communication system, allowing the vessel mover controller to have expertise in moving individual carriers and operating track system 160.

A fourth type of track segment is a curved track segment 190. Curved track segment 190 provides a 900 bend with a predetermined radius (or other angular bend). This radius is preferably the same as the radius used in turns when switching track segments 184 are switched into a curve. The radius is chosen to minimize the space impact of curves while, at the same time, allowing carriers to move quickly around curves without encountering drastic lateral forces. Thus, the space requirements and speed requirements of automation track 160 can determine the radius of curved segments 190.

Electrically, curved segments 190 are substantially the same as straightaways 186 and 188. Each of these segments includes a plurality of coils that are activated, in sequence, to provide a linear motor in conjunction with magnets in the bottoms of carriers. Each coil is activated to provide a push or pull force on drive magnets placed in the bottom of each carrier. The speed at which coils are activated in sequence determines the speed of the carrier on that section of track. Furthermore, carriers may be moved into a position and stopped at a predetermined location with high resolution by activating coils at that location.

Figure 8:
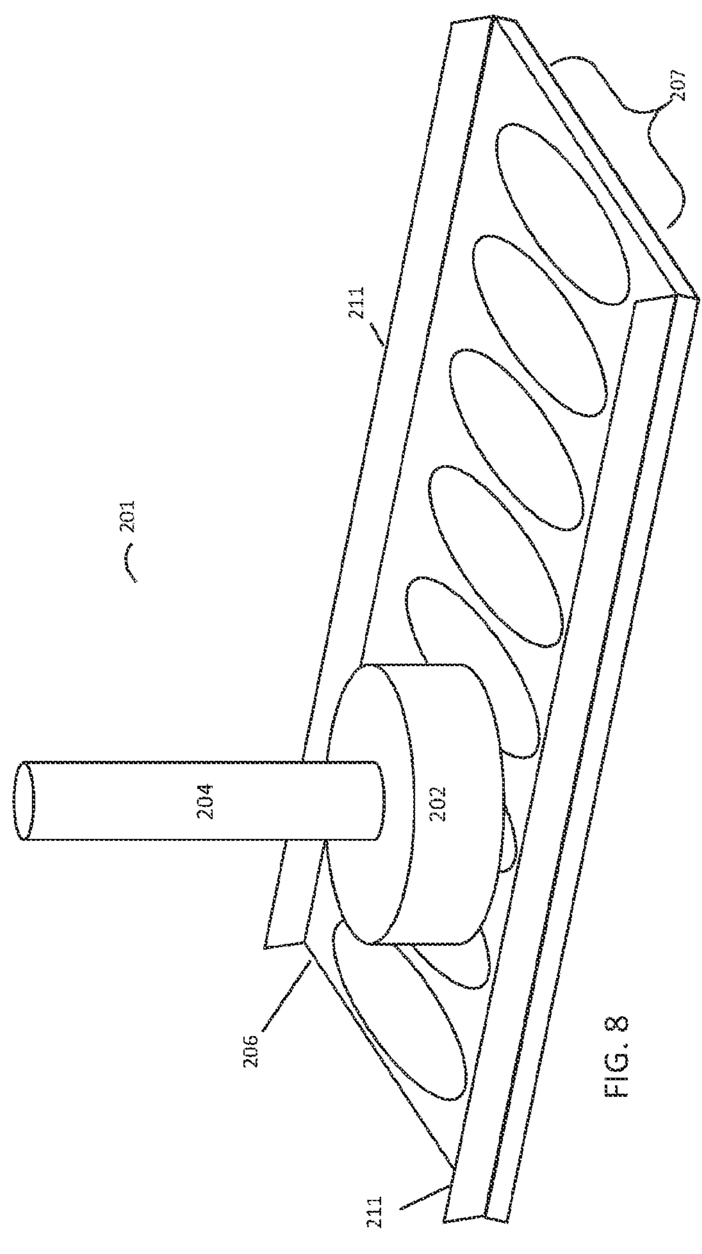
FIG. 8 is a diagram of a track segment of a liquid handler system, in accordance with at least one aspect of the present disclosure.

FIG. 8 shows an illustrative embodiment of a track segment 201 of an automation track system 200, such as the track system 160 as shown in FIGS. 4-7. As generally described above, the automation track system 200 is configured to support one or more vessel movers 202 (also referred to as a "carrier" or "sample carrier"), which are configured to receive a vessel 204 therein. The track segment 201 can include a riding surface 206, which is the upper surface of the track segment 201 that supports the vessel mover 202 thereon and along which the vessel mover 202 is transported between the modules or components of the automation track system 200. In some embodiments, the riding surface 206 can include an active region 207 that the vessel mover 202 is intended to move along. As shown, the active region 207 is the area corresponding to coils embedded in or below surface 206. The active region 207 can generally correspond to the medial portion of the riding surface 206, and the relative width or the region 207 (as defined by the coils) is a design choice affected by the placement of magnets in mover 202. If any liquid contaminants are present on the active region 207, they could negatively impact or otherwise impair the movement of the vessel movers 202, as noted above. In some embodiments, the track segment 201 could include a PCB substrate, as generally described throughout. Optionally, guide rails 211 can be used to help limit the lateral placement of mover 202 relative to the track and active region 207.

Figure 9:
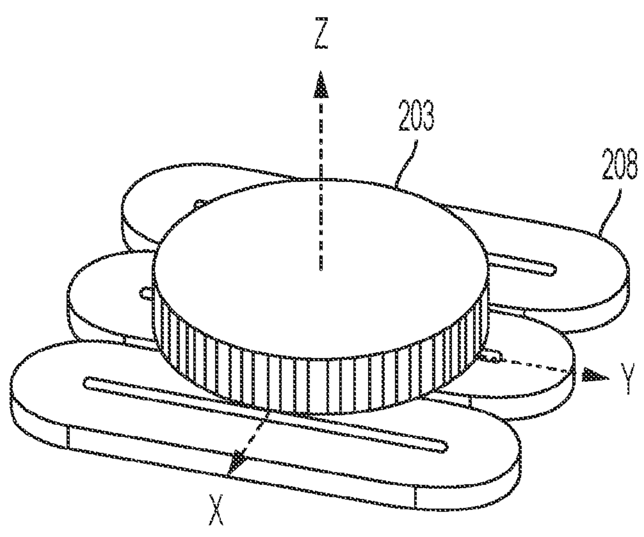
FIG. 9 is a diagram of a vessel mover actuator, in accordance with at least one aspect of the present disclosure.

Further, as shown in FIG. 9, the track system 200 can include one or more coil arrays 208 associated with each track segment 201. The coil arrays 208 can be configured to generate a magnetic field that interacts with the magnet 203 positioned within the base of the vessel movers 202. The coil arrays 208 and the vessel mover magnet 203 can collectively define a linear electromechanical actuator. By synchronously controlling the coil arrays 208, the track system 200 can propel the vessel movers 202 (and, thus, the vessels 204 containing any samples or other liquids held thereby) across the track segments 201 to the desired module or other component of the liquid handler system.

Additional information regarding transport systems for liquid handlers can be found in U.S. patent application Ser. No. 16/319,306, which is incorporated by reference above.

Figure 10:
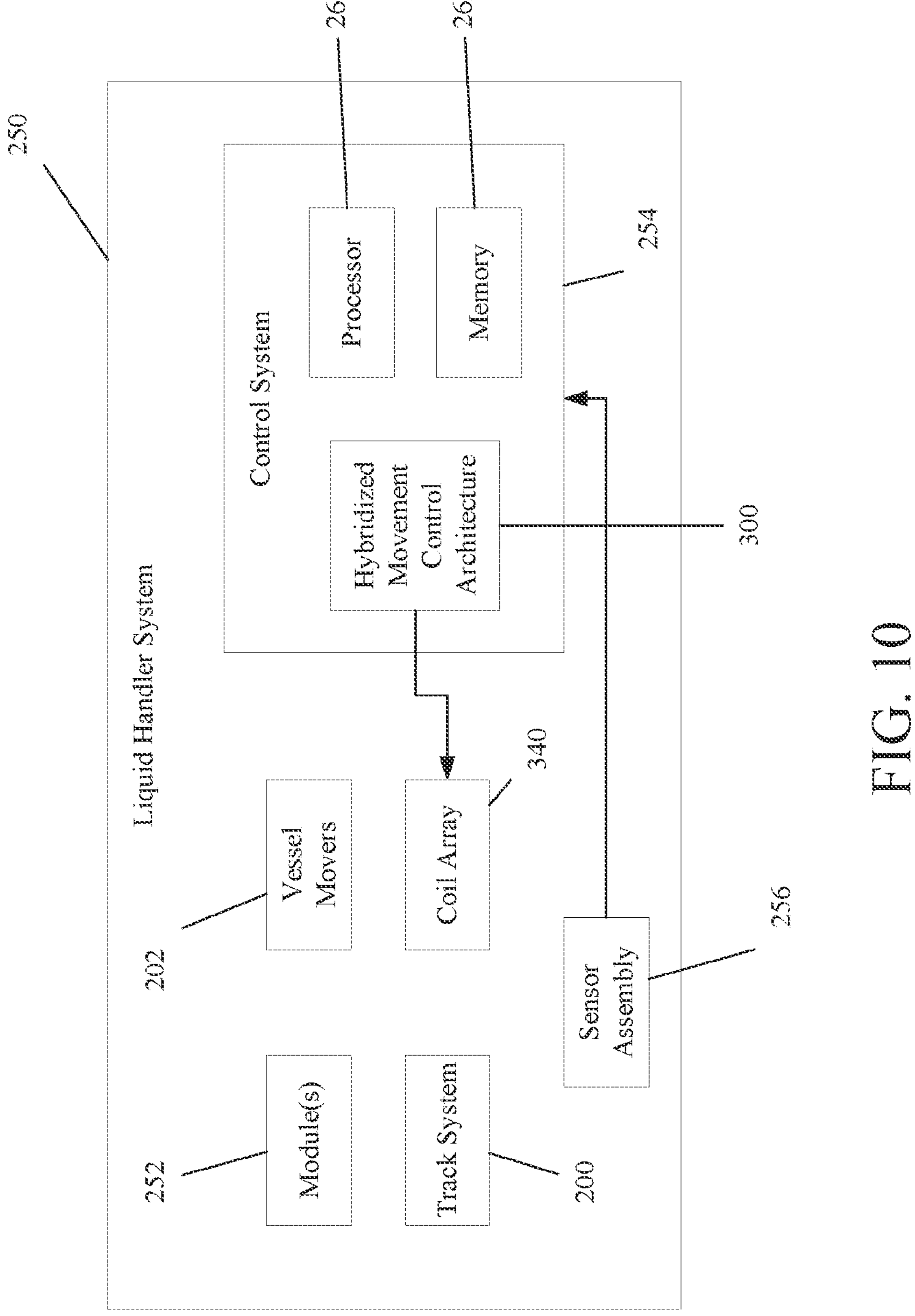
FIG. 10 is a diagram of a liquid handler system including a vessel tracking system, in accordance with at least one aspect of the present disclosure.

As generally described above and shown in FIG. 10, liquid handler system 250 can include a one or more modules 252 that are configured to process liquid samples, a track system 200 interconnecting the various modules 252, vessel movers 202 that receive the liquid samples and transport the liquid samples between the various modules 252 along the track system 200, and a coil array 340 associated with the track system 200 that is configured to drive the vessel movers 202 therealong. The liquid handler system 250 can further include a tracking system 258 that is configured to monitor the locations of the vessel movers 202 along the track system 200 and control the movement and/or routing of the vessel movers 202 accordingly. The tracking system 258 can further include a control system 254 and a sensor assembly 256 (e.g., one or more Hall effect sensors) that is associated with the track system 200 and configured to detect the vessel movers 202 therealong. The control system 254 can be coupled with the coil array 340 and is configured to control the coil array 340 in order to control the movement and routing of the vessel movers 202 along the track system 200, which in turn allows the vessel movers 202 to transport the liquid samples between the modules 252 in particular sequences and with particular timings according to the types of liquid samples being processed by the liquid handler system 250. The control system 254 can include hardware, software, firmware, or any combination thereof that is able to execute the described functions. In the illustrated embodiment, the control system 254 includes a processor 260 coupled to a memory 262 storing instructions that, when executed by the processor 260, cause the control system 254 to execute the described processes, steps, and/or functions. Control system 254 includes a hybridized movement control architecture, which is a circuit and/or related control software that monitors activity of vessel movers, such as RFID signatures and Hall effect sensors, and controls the selective application of synchronous currents to relevant coils in the LSM track. This creates a magnetic field to propel the one or more magnetic vessel movers along the track. The application of these currents can be done in accordance with a software-defined desired motion profile for the vessel mover and can be adapted based on real-time feedback from Hall effect sensors (or other motion sensors, such as optical) in the track to move the vessel movers in accordance with a desired control scheme.

PCB Printed Coils

Existing electromagnetic actuator topologies include a combination of conductive wire wound round a bobbin in curved shapes which are then augmented by mechanical diverter mechanisms comprising engagement arms and associated motors to guide vessel movers off linear paths. These solutions are cumbersome to manufacture and suffer part to part inefficiencies due to the coil winding process and ability to assemble and align separate motor segments.

Embodiments instead utilize PCB manufacturing techniques in conjunction with movable vessel movers/carriers with bodies containing permanent magnets. A coupled electromagnetic device is created that is only possible due to the specific physics achievable within a PCB fabrication combined with mover and load constraints required by the application. A particular arrangement of artwork used to retain copper within the layer stack is prescribed which creates an exact relationship of resistance, inductance and mutual capacitance, which by design creates a specific relationship between factors optimized for the particular motion characteristics required by laboratory automation entities.

Spirals are formed on many PCB layers which are interconnected by vias through the substrate layer stack to create a coil with electrical properties that balance the thermal dissipation of copper losses with nominal and peak thrust forces required by the system. These interconnections are in some cases through the entire substrate stack and in others only connecting specific layers. The arrangement of spirals including but not limited to the width of copper, the separation from adjacent current carrying conductors, the exact shift of spirals between layers, the length of copper between end caps, the gap at the center of a spiral stack and the gap between adjacent spirals, as well as other design artifacts are all interdependent and optimized as a multi-objective solution.

The arrangement of spirals on each layer within the PCB layer stack creates sets of coils that enable electromagnetic forces to be produced in different directional axes. With coordinated switching of the coil layers, a coupled magnetic mover can then be motivated in different axes of motion with respect to the physical PCB. Motion may be along, across or a combination of more than one axis of the PCB substrate. Moreover, higher level routing between paths of travel may be achieved by designated motions such as performing 90 degree turns at the end of linear travel, a four-way diversion onto a perpendicular lane of travel, or continuation of a linear path without any mechanical assistance devices.

Embodiments presented here rely on physical contact between the static portion of the motor and the movable entities. Unlike typical linear motor designs there are no constraints on the motion of the moving parts relative to the stationary parts. In some embodiments, there are no contact guides, mechanical devices or bearings employed other than the normal friction that results from entities resting on the stationary PCB substrate. The friction resulting from the normal contacts are managed by material choices to minimize the friction, whilst at the same time ensuring the life of the surfaces is sufficient for the intended system lifespan. Coating can be applied to the PCB substrate and also the entity base (magnet and/or entity structure) to perform in concert as a pair achieving a specific regime of slip-stick friction that the automation control system uses for exact positioning of entities relative to the PCB substrate.

Furthermore, the manufacturing processes of PCB design yield extremely high-quality surfaces and tight geometric tolerances that enable a novel segment-to-segment alignment scheme to be achieved. Features and flexible material selections in the supporting structure align the separate PCB motor segments which ensure seamless transfer of entities from one segment to another. This can be an important capability of laboratory automation solutioning in which open tubes of patient samples are conveyed over hundreds of segments in very larger laboratory solutions.

The designs of the electromagnetic system, mechanical system, thermal systems and controller architecture described above are tightly coupled, each providing features and functionality to the other as part of the optimization that manifests the complete laboratory automation solution.

By using a PCB arrangement rather than winding insulated copper wire mechanically, any specific profile of the individual traces making up a coil can be easily created in design software. Coils can have a thickness dictated by the specific PCB manufacturing process selected, which may allow foils of any reasonable thickness to be used for each layer. Trace widths are dictated by the computationally created photoresist masks that are used during the printing process. Thus, a total cross-section for each coil trace can be selected as part of the design process without complicating the manufacturing process. Similarly, the gaps between individual layers of spiral coil traces are dictated by the properties of the layers selected, including the thickness of core or prepreg layers and their dielectric properties. Within each layer, the gap between adjacent traces in a spiral can be selected in the printing mask. In contrast, traditional wound coils are limited to a single round profile of copper wire and the dielectric thickness for the wire that is wound around a bobbin.

Similarly, the exact shape of each coil spiral can be selected during the design process, resulting in a photoresist mask and resulting coil traces having the desired shape. Because a printing process is used, there is generally no substantial penalty incurred by choosing one shape or another during the manufacturing process. This means that the outer profile of the windings can appear more rectangular to maximize the amount of copper used in the coils and the uniformity of the field. Any other design considerations can also influence the exact shape of the PCB spiral layers. Furthermore, individual spiral layers can have slightly different profiles and individual traces within each spiral can have different shapes with, etc. This allows coil design to be optimized to field parameters. Finally, because the PCB manufacturing process is controlled by a precise masking and etching process, repeatability between the different PCB boards can be easily achieved with high quality results.

Figure 11:
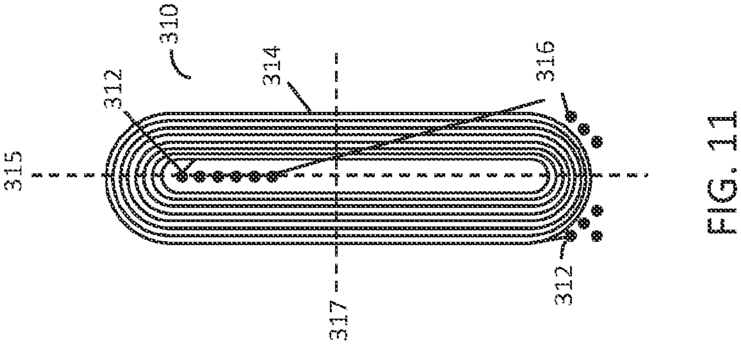
FIG. 11 is a top-view of a PCB coil in accordance with at least one aspect of the present disclosure.

FIG. 11 is a top view of a PCB coil 310. The primary component of PCB coil 310 is a stack of spiral traces 314 in a multi-layer PCB. Spiral traces 314 can be printed on multiple layers of the PCB during the PCB fabrication process to allow a greater number of turns of PCB coil 310. Spiral traces 314 can be printed in a clockwise or counter-clockwise direction depending on the application. Each layer of spiral traces 314 can spiral inward or outward along a conductive path, which can differ between layers. Layers of spiral traces 314 can be interconnected to one another by vias 312 and 316. Vias include what will be referred to as intra-coil vias 316 that connect one end of a single layer of coil trace to one end of a coil trace in an adjacent layer, allowing one large stack of traces to form a single conductive coil. Vias also include what will be referred to as terminal vias that provide a conducting path to the top layer and bottom layer of a coil stack, allowing electrical connection to the terminals of stacked coil.

Multi-layer PCBs can be constructed using any applicable technique including by laminating alternating insulating layers with etched layers of copper (e.g., etched by masking and activating a photoresist layer that then allows the selective masking of copper when the copper layer is chemically etched). Vias are drilled and filled with a conductor (copper) to provide electrical paths between the etched copper layers. In general, coil 320 is an elongated coil having a long axis 315 and a short axis 317. Adjacent coils are placed along a track such that an edge (right or left) of each coil intersected by the short axis is substantially parallel with an edge of each adjacent coil (such as shown in FIG. 14A). By arranging coils in this manner, within each PCB and by placing PCBs together, form continuous groups of coils creating one or more continuous path for the magnetic vessel movers to move along. That is, the coils are places adjacent to one another in a horizontal plane defined by the PCB track surface, such that their longer sides are adjacent.

Figure 12:
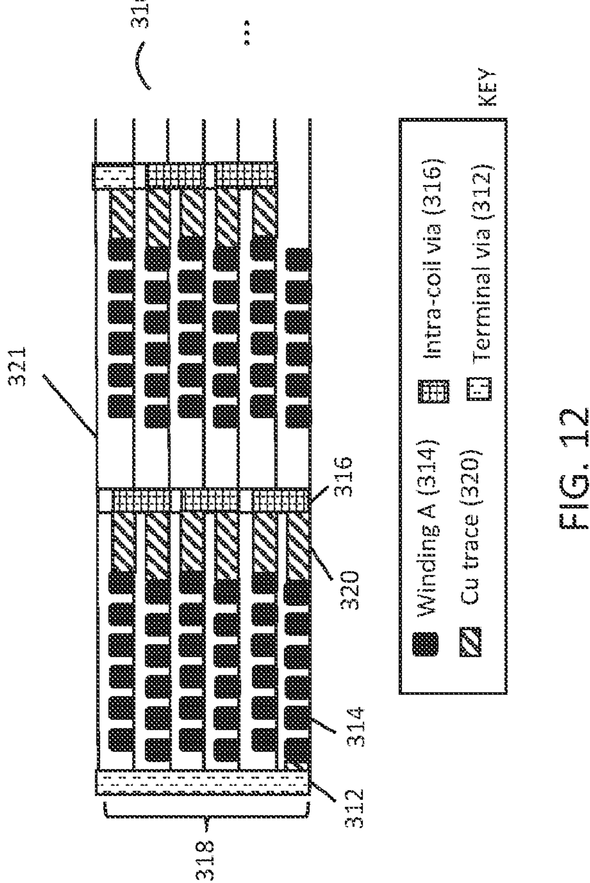
FIG. 12 is a cross sectional view of a PCB coil in accordance with at least one aspect of the present disclosure.

FIG. 12 is a conceptual illustration of the cross section of PCB coil 310, without the specific details of the insulator materials. Coil 310 is created by laminating layers 318, which are made up of etched copper layers and an insulating dielectric material such as fiberglass and resin core or prepreg sheets that are laminated in the presence of heat and vacuum. Any number of layers 318 can be used, allowing any number of turns in printed coil to be created (the number of turns in each spiral times the number of layers of spirals gives the total turns for the printed coil 310). For example, a few hundred turns can be achieved by a dozen turns per spiral layer and twenty layers. The exact arrangement of traces within each spiral and how those traces are spaced relative to adjacent layers can be chosen to meet EMI or other specifications. In some embodiments, each conductive coil comprises at least twelve single-layer spirals, and each spiral comprises at least twelve turns.

In the single-coil example shown in FIG. 12, the races forming the spirals are shown in black, while the copper traces 320 that run from the spirals to vias 312 and 316 are illustrated separately for clarity. While vias are illustrated as overlapping in the two-dimensional cross section, the vias do not actually overlap, instead being formed in separate holes in the PCB. Top surface 321 of the PCB provides a track surface for vessel movers. In some embodiments, a low friction surface, such as s high density polymer (HDPE, UHMWPE, or UHMW adhesive films), liquid photoimageable solder mask (such as LP-40), or PTFE, is applied to surface 321 after PCB manufacturing to facilitate smooth movement of vessel movers.

Figure 13:
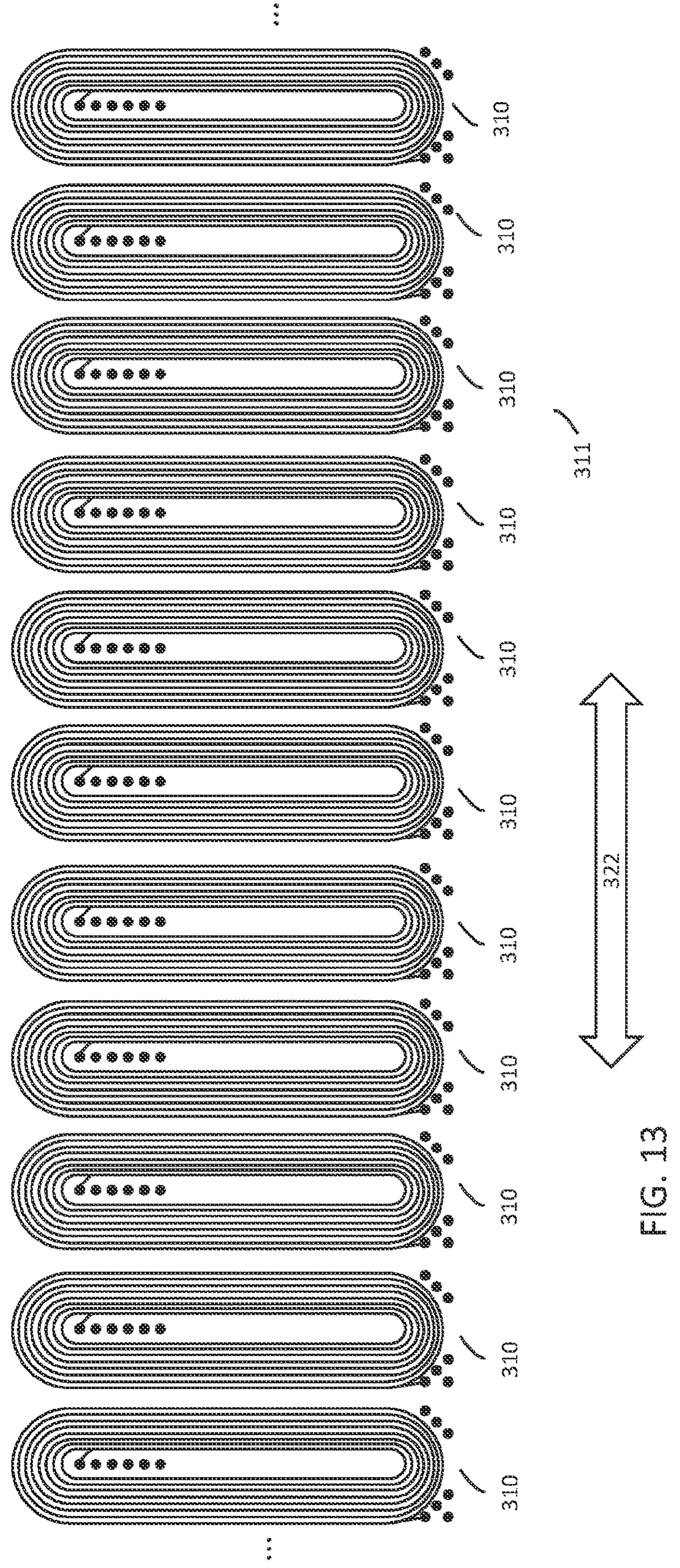
FIG. 13 is a top-view of a PCB coil track in accordance with at least one aspect of the present disclosure.

FIG. 13 shows a series 311 of parallel PCB printed coils 310. By printing these coils in parallel, they can be synchronously activated to create a moving magnetic field to drive a magnet in the base of a vessel carrier in either direction along direction 322. Depending on design requirements, any suitable number of coils can be printed on a single board and additional boards can be placed adjacent to one another to create a track of any length. In this example, the demarcation between separate PCB boards is not shown. In some embodiments, six coils are printed per PCB board.

Figure 16:
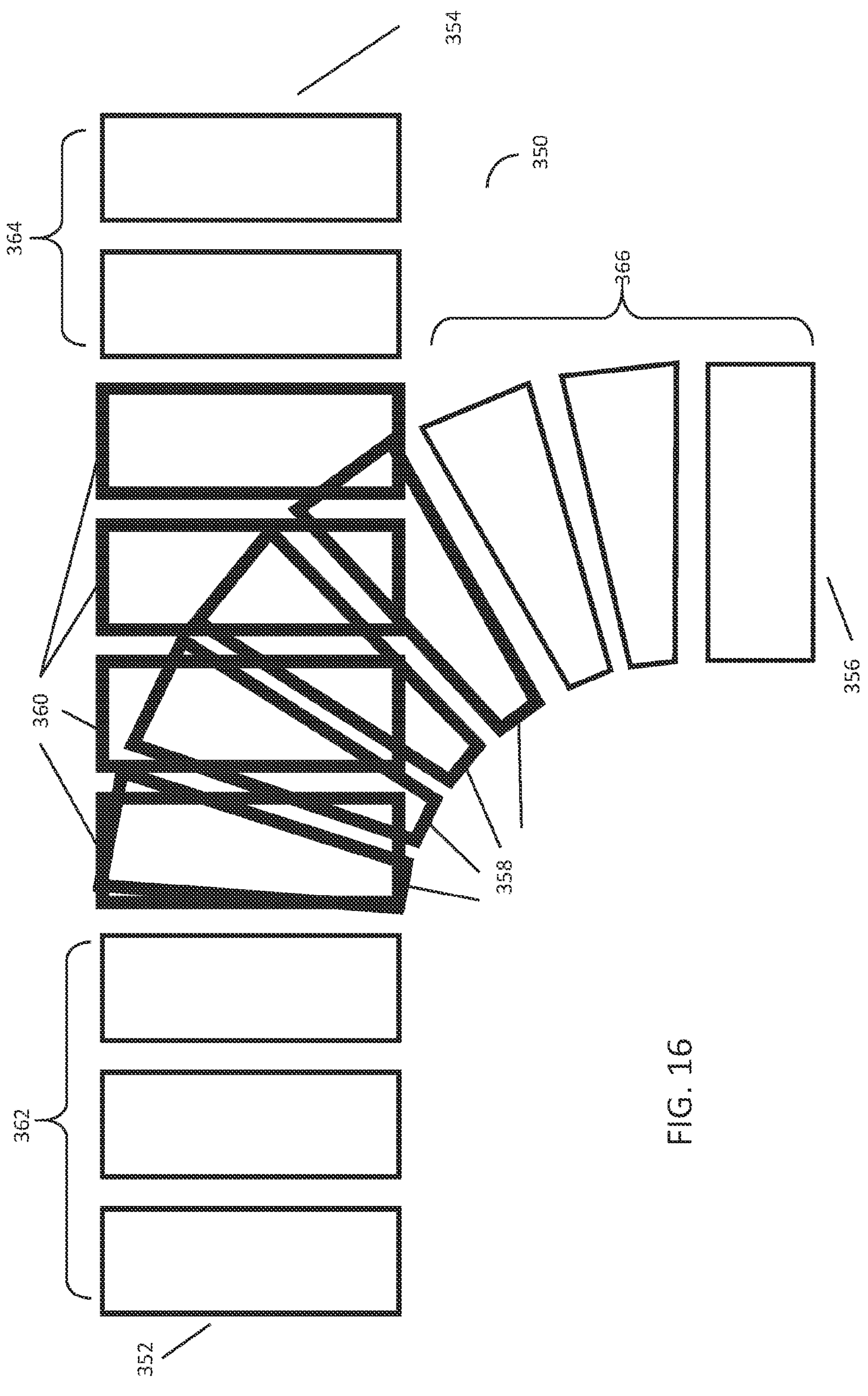
FIG. 16 is a top-view of a PCB coil track intersection in accordance with at least one aspect of the present disclosure.

The example shown in FIG. 13 is a simple straightaway where symmetrically oval coils are oriented in parallel. As explained below, different arrangements can be created for curves and junctions, such as adding a trapezoidal component to the shape of the oval coils and aligning adjacent coils to have parallel edges (such as shown in FIG. 16). The specific aspect ratio of the coils, width and length, center size, overall shape, and spacing between coils can be selected to create an LSM with desired physical properties.

FIG. 14A illustrates how an intersection that can be created using PCB printed coils. Unlike traditional bobbin-wound coils, PCB coils are substantially thinner for the same number of turns. This means that two coils can be stacked upon one another without moving the track surface substantially away from the edge surface of the coil. When a magnet is spaced away from the surface of a spiral coil, the magnetic field diverges, and the field is less uniform and strong due to fringing effects. Therefore, it is desirable to keep the surface of the track as near to the top edges of the horizontally-laying coils as possible. This is unachievable with traditional mechanical windings.

Here, coils are laid out in two intersecting directions, direction 322 as shown in FIG. 13 and perpendicular direction 324 as shown here. Note that directions 324 and 322 need not be perpendicular, in some embodiments, as any intersection layout can be achieved using stacked PCB coils. The arrangement shown in FIG. 14A can be logically grouped into two directional groups of coils. Coil group 328 is arranged horizontally along direction 322. Coil group 326 is arranged vertically in the page along direction 324. An intersecting group of coils 330 contains coils of both sets, stacked on one another or interleaved with one another. PCB coils 310A in group 326 can have substantially the same as or different characteristics from coils 310, depending on design requirements. To move a carrier from path 322 to path 324, a carrier can be moved to the intersection at coils 330 by selectively and synchronously activating coils in set 328 to move the magnet in the carrier to the intersection. Once the magnet has been moved to the intersecting group of coils 330, the coils within set 326 can be synchronously activated to move the magnet along path 324. Alternatively, if the carrier is not to turn at the intersection, the coils in group 328 will continue to synchronously activate. The specific direction in which a carrier moves along path 322 or 324 is dictated by the order of synchronous activation of the coils.

Coil groups 326 and 328 form two paths of horizontally (in the plane of the PCB) adjacent coils. Each group provides a different direction of possible motion for vessel movers propelled by the selective creation of a magnetic field within each direction group of coils 326 and 328. By overlapping parts of each coil group 326 and 328 below the PCB track surface, an intersection is formed, allowing a vessel mover to selectively move between each directional group or continue on the same path as the directional group of coils that propelled the vessel mover to the intersection.

Figures 14B, 14C:
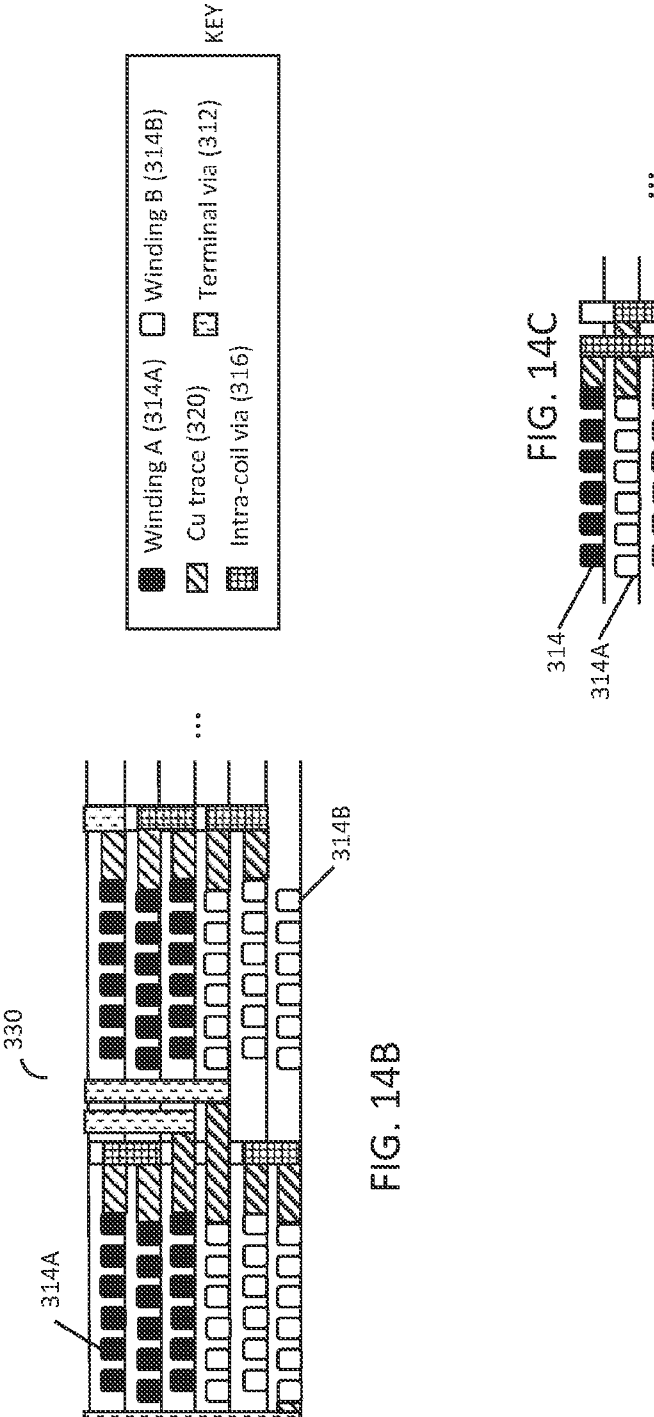
FIG. 14B is a cross sectional view of a PCB coil intersection in accordance with at least one aspect of the present disclosure.
FIG. 14C is a cross sectional view of a PCB coil intersection in accordance with at least one aspect of the present disclosure.

FIG. 14B shows a cross-section of the PCB layers used to create the stacked coils in section 330. It should be appreciated that only six layers are shown for illustration purposes, but in practice many more layers would likely be used depending on the application. In this example, solid black windings 314A illustrate the topmost coil, while white windings 314B illustrate the windings in the bottom coil. Each coil is created by stacking spirals that are electrically coupled through intra-coil vias 316, linked by copper traces 320. Terminal vias 312 provide terminal leads for a circuit to provide a current to each individual coil. It should also be appreciated that while FIG. 14B shows individual windings of the two stacked coils directly on top one another, the individual traces of the windings for each stacked coil go in different directions and only have this stacked arrangement at the intersection of the individual traces. That is, there will be portions of each stacked coil where the windings from the topmost coil are not directly atop the windings of the bottom most coil, as can be seen in FIG. 14D.

In some embodiments, the stacked coils of windings 314A, 314B are laminated into a single monolithic PCB board having a number of layers that is at least twice the number of layers of each coil. In some embodiments, stacked coils can be created by creating two separate PCBs for each coil group and then stacking those PCBs. These stacked PCBs can be affixed to one another using any suitable fixation technique, such as epoxy or screws.

When stacked coils are created using a single laminated PCB, it is also possible to interleave the windings of each coil such that the topmost surface of each coil is roughly adjacent to the surface of the PCB. Such an example is shown in FIG. 14C, where layers of windings 314A and windings 314B are printed on interleaved laminated layers of the PCB. This requires slightly longer vias to connect the non-adjacent layers to form a single coil.

Figure 14D:
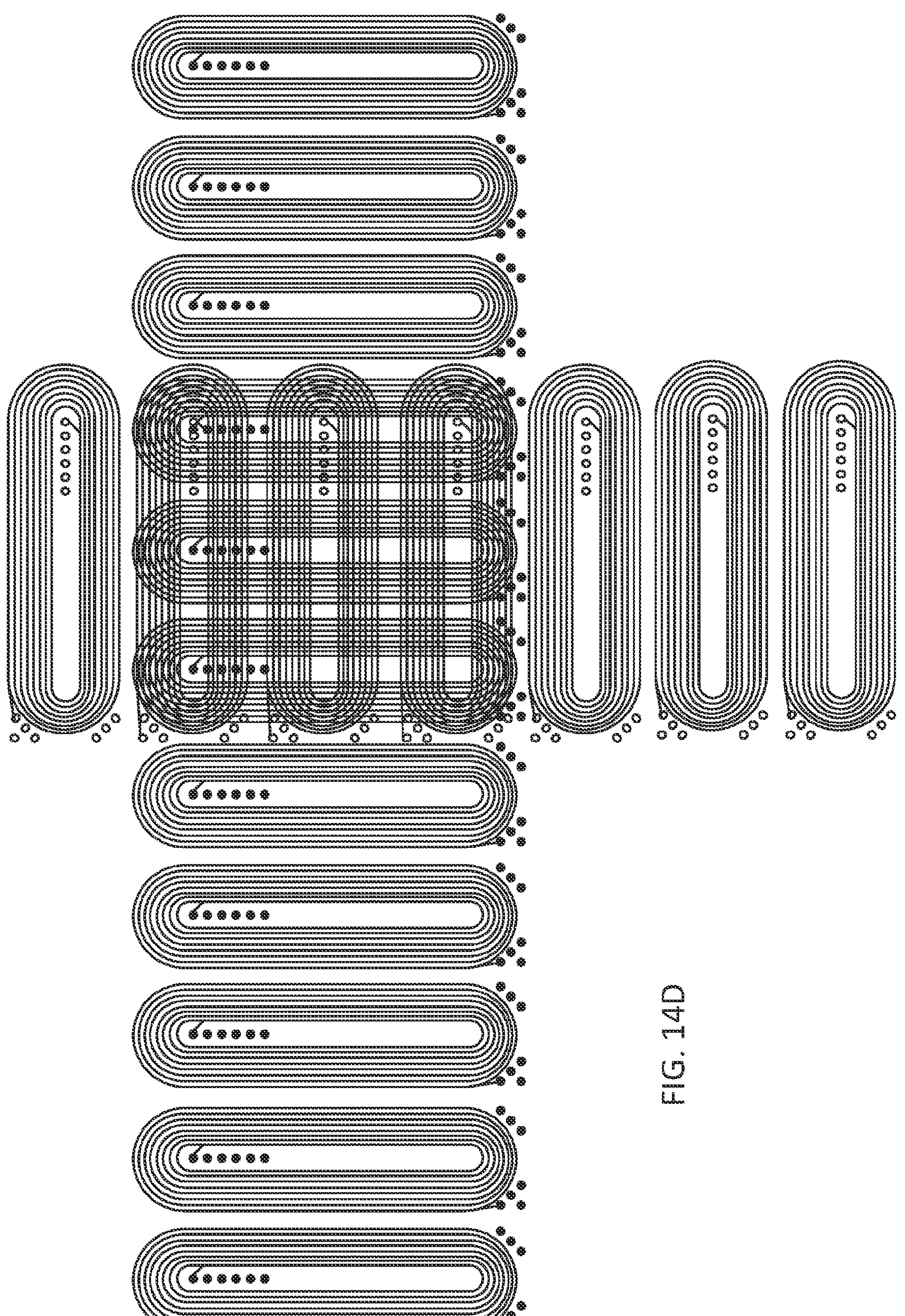
FIG. 14D is a top-down x-ray view of a PCB coil track intersection in accordance with at least one aspect of the present disclosure.

FIG. 14D is an x-ray view showing an exemplary arrangement of stacked coils to illustrate the individual traces and show how they intersect in the adjacent PCB layers. The arrangement of vias is merely conceptually illustrative. The specific arrangement of vias for stacked coils in a monolithic multi-layer PCB would be carefully selected to avoid interfering with individual traces of the stacked spirals.

Figure 15A:
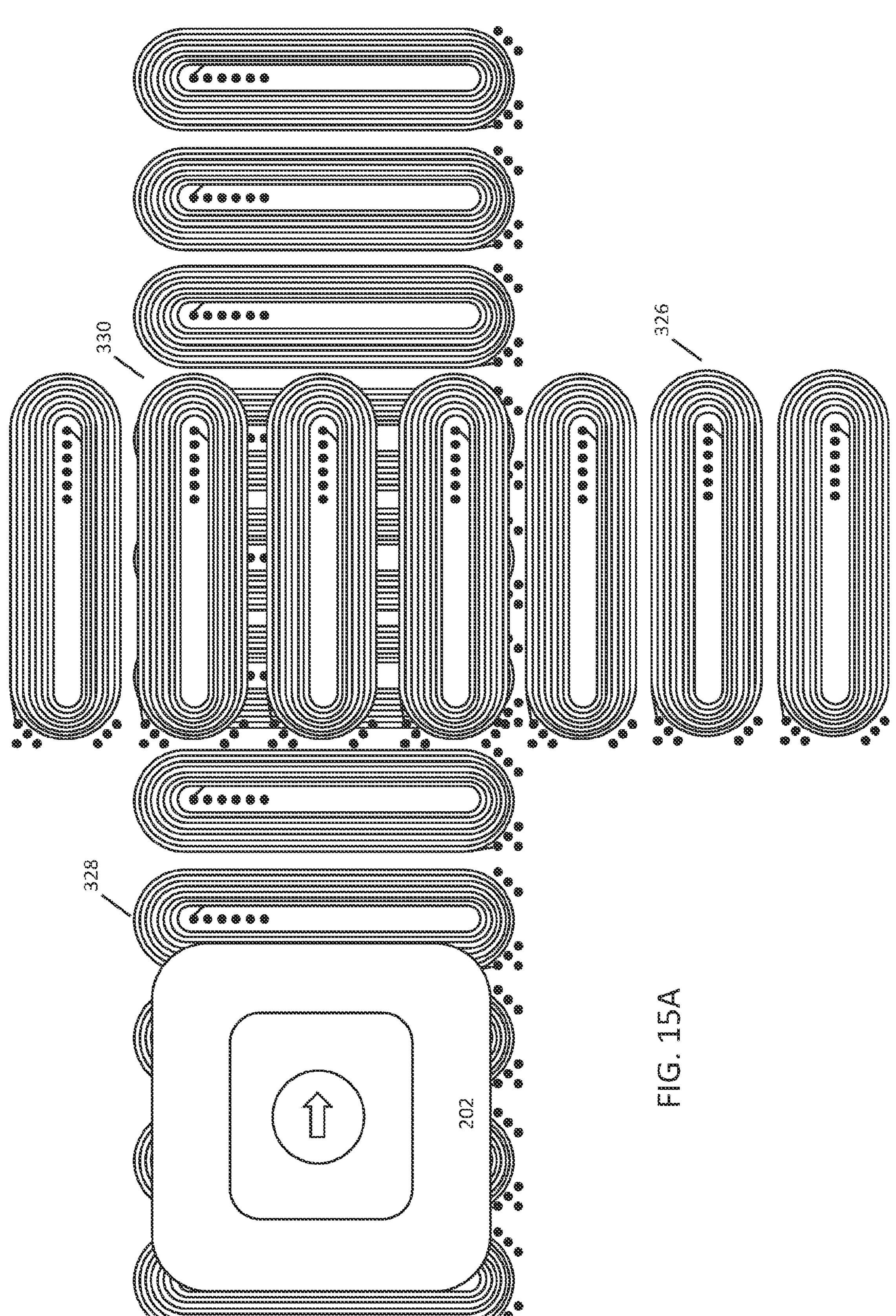
FIGS. 15A-C is a top-view of an exemplary vessel mover traversing a PCB coil track intersection in accordance with at least one aspect of the present disclosure.
Figure 15B:
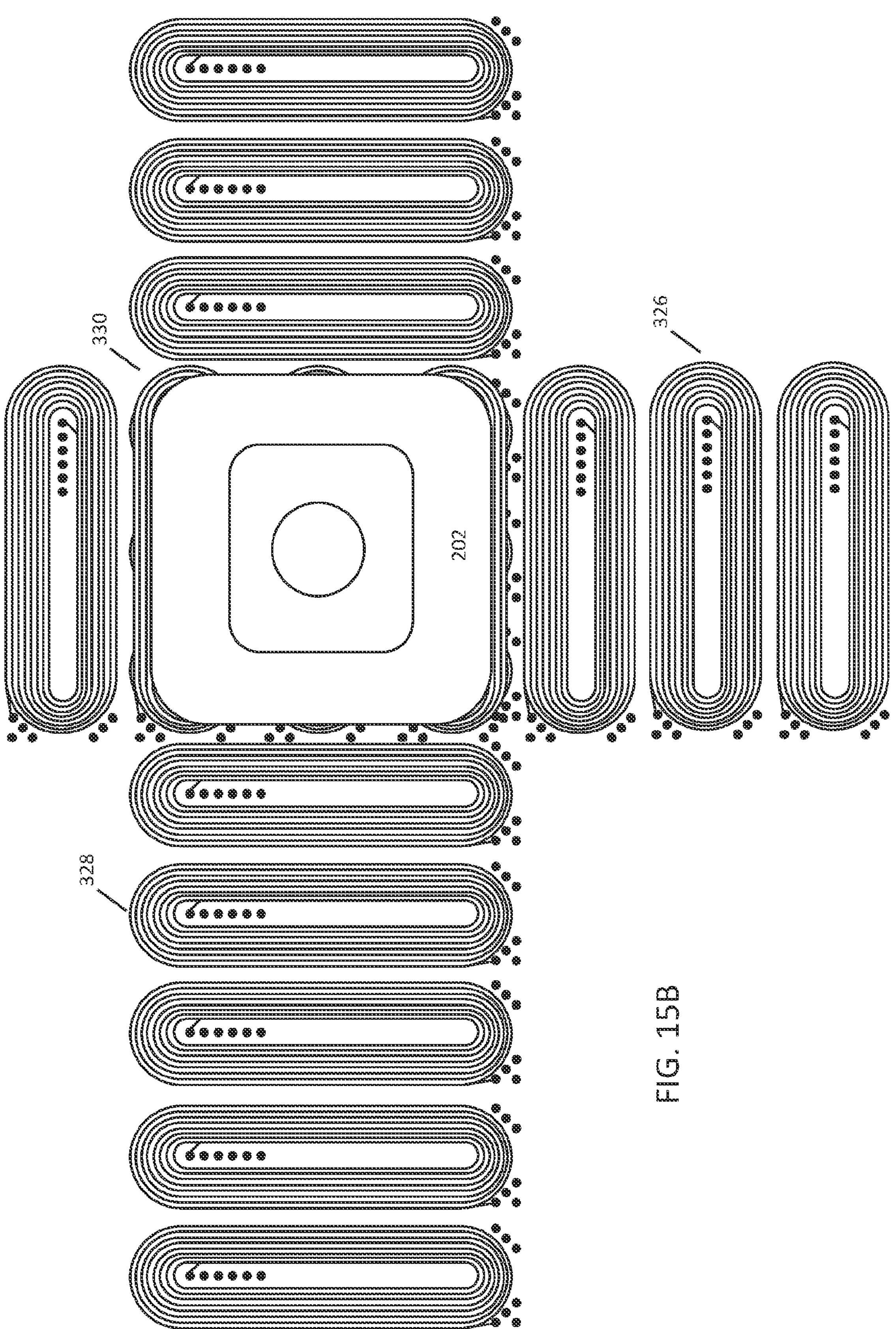
Figure 15C:
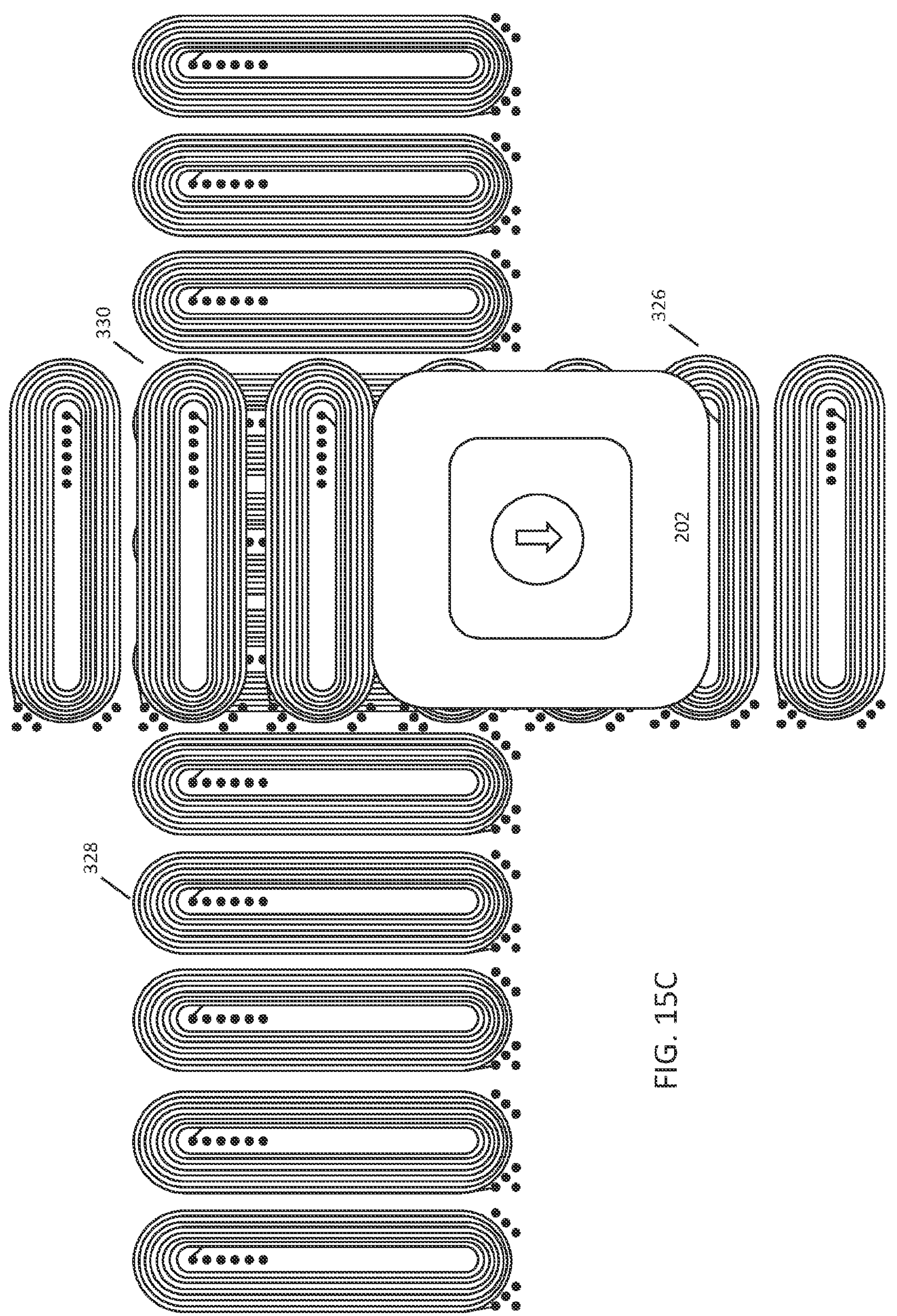

FIG. 15A through 15C shows an exemplary progression of a carrier traversing the intersection first illustrated in FIG. 14A. A carrier 202 travels along the coil set 328 left to right. (In this example, carrier 202 is depicted as somewhat rectangular, but in some embodiments, carrier 202 can have a circular base, as shown in FIG. 8.) This is accomplished by synchronously activating coils 328 to create a moving magnetic field that guides the magnet(s) or conductors having a magnetic field (e.g., electromagnets or induced fields) in the base of carrier 202 from left to right.

Once the magnets in the base of carrier 202 reach the intersecting group of coils 330, the current through coils 328 can be reduced or stopped and currents in group 326 can be synchronously applied to create a moving magnetic field that goes down the page. Thus, in FIG. 15C, carrier 202 is moving down the page along coil group 326. Currents are no longer applied to coil groups 328, and currents are applied synchronously to coil group 326 to create a localized moving magnetic field that moves down the page.

While a perpendicular intersection is illustrated in FIGS. 14A through 15C, any angle can be used. For example, as shown in FIG. 16, the paths of intersection 350 do not need to be completely linear. Coils shown in FIG. 16 are shown conceptually, with the individual shapes of the coils generally having more rounded corners in practice. FIG. 16 shows a non-perpendicular intersection similarly to PCB 2 shown in FIG. 1. However, in prior art wound-coil boards, coils are too thick to be stacked with desired field characteristics, necessitating non-uniform shapes and sizes for the coils on forking paths, as shown in FIG. 1. Intersection 350, in contrast, allows any desired coil shape as the top coils are stacked with the bottom coils so they do not compete for space. Because they are stacked, there is no need to use smaller coils for one branch versus the other. This allows for a more uniform electric field to be used in the intersection without favoring one path or the other.

In exemplary intersection 350, a single path 352 (left) diverges into two branches, straight path 354 and right path 356. This allows path 352 to branch without requiring carriers to slow down substantially at the intersection (acting more like a highway offramp than a perpendicular intersection. To accomplish this at least some of the coils of path 354 are at least partially stacked in the PCB with the coils in path 356. For example, coils 358 (which have an overall trapezoidal shape) of path 356 are printed in a stacked manner with coils 360 (which have an overall oval or rectangular shape) of path 354. Meanwhile, coil groups 362, 364, and 366 of path 352, 354, and 366, respectively, can be printed in PCBs without stacking with other coils. Thus, these coil groups may be created using PCBs with fewer layers to reduce cost. Coils 360 and 358 can be created in a stacked manner using any of the techniques discussed herein, such as interleaved, separate contiguous layers in a single PBC, or as separate multi-layer PCBs that are affixed atop one another after each PCB is manufactured.

It should be appreciated that the synchronous activation of coils can be selected according to a predetermined motion profile that sets maximum acceleration and/or maximum velocity constraints to limit vessel spilling. That is, the exact location of the magnetic field created by the selection and activation of a coils can move according to a motion profile that accounts for acceleration and maximum velocity for the application. For example, the motion profile can slowly accelerate a carrier to avoid spillage, moving the carrier faster as it continues to accelerate. Similarly, as a carrier approaches an intersection, such as the perpendicular intersection shown for 330, the carrier can slow down by applying a decelerating motion profile to your magnetic field, activating adjacent coils in a decelerating manner. Motion profiles are typically achieved by sending controller signals to driver amplifiers under software control. Software modules monitor the motion of each carrier and control the application of synchronous motor signals to the coils to achieve a desired trajectory.

Figure 17A:
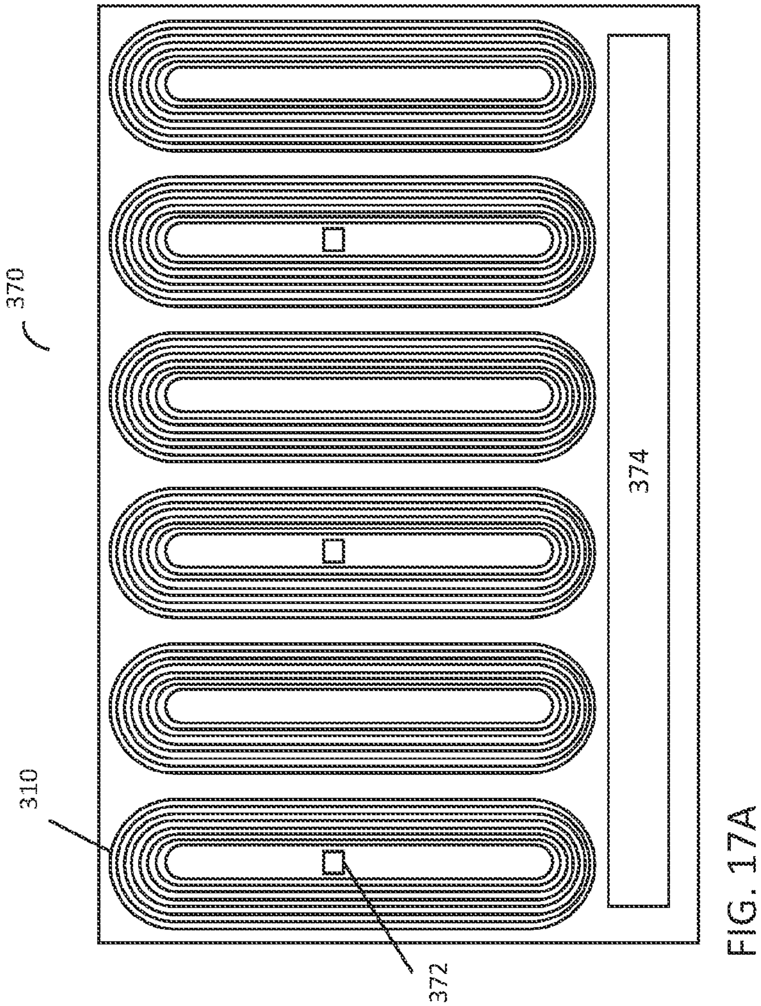
FIG. 17A is a top-view of a PCB having a coil track in accordance with at least one aspect of the present disclosure.

As explained, coil tracks can have a series of adjacent PCBs each having multiple coils. These PCBs can be linked together to form a linear track of any dimensions. This is similar to how wound coils were arranged into coil boards in a FIG. 1. FIG. 17A shows an illustration of a six-coil PCB track section 370. Track section 370 comprises six PCB printed coils 310 arranged adjacent to one another to form a short linear track path. These coils can have a different overall shape (e.g. trapezoidal) to allow other track geometries. Generally, coils are arranged adjacent to one another such that adjacent edges are substantially parallel. In the example shown in FIG. 16, coil group 366 includes trapezoidal and rectangular coils, but their adjacent edges face one another in such a way that a smooth curve is created. This substantially parallel relationship of adjacent edges can include perfectly parallel edges or slight wedges that match the trapezoidal profile of the adjacent coils in accordance with the curve.

Sensing of the entity locations with respect to a PCB substrate described is achieved by Hall sensors in specific locations on the same or adjacent PCB substrate/assemblies. Some embodiments do not use the traditional linear region of Hall sensor response. Instead, a set of numerical receipts are employed that makes use of one or more axis responses from a Hall sensor, from one or more Hall sensors to construct a position relationship between the entity and sensors. A sparse arrangement of sensors is achieved by using all the dynamic range from each sensor along with specific placement in ratio to coil locations. The specific position of Hall sensors is designed based on the information required, capabilities of the sensor with respect to the distance from the entity magnets and the function required at the location of sensors (for example a linear conveyance or directional change).

Hall effect sensors 372 can be included in the PCB 370, such as by soldering surface mount devices to pads on the PCB. By regularly placing Hall effect sensors along a track, the specific location of an individual carrier and its motion can be recorded and observed. Similarly, Hall effect sensors can provide real-time feedback about the overall health of the coils that they are adjacent to. These sensors can observe the magnetic field in its vicinity. This magnetic field will change as coils are activated and as the magnets in vessel carriers move on the surface above the hall effect sensor. Various computational approaches to utilizing Hall effect sensor data can be used to improve the handling and control of vessel carriers. One example of utilizing Hall effect sensor information is discussed in US patent application. XXX {to insert 137519.12900 application number}, which is incorporated herein by its entirety.

In addition to Hall effect sensors, other electrical components to assist the control and operation of the LSM track can also be incorporated into PCB 370. In some embodiments, motor controller circuits 374 can be placed on board 332. These can include FPGA or processors that control amplifiers mounted to PCB that provide a precise current to each individual PCB coil 310. This allows the coils to be activated synchronously according to a motion profile. In some embodiments, the motor control and drivers are mounted on a separate PCB, electrically coupled to coils 310.

Figure 17B:
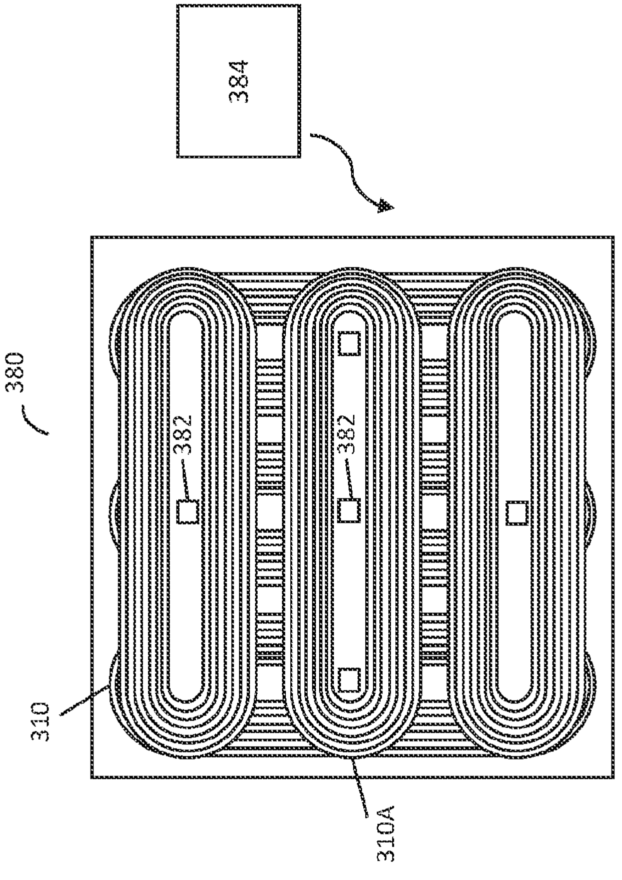
FIG. 17B is a top-view of a PCB having a coil track intersection in accordance with at least one aspect of the present disclosure.

FIG. 17B shows a PCB 380 that includes an intersection of two coil paths that includes a group of coils like group 330 in FIG. 14A. like coil group 330, PCB 380 includes stacked coils, 310 and 310A which are oriented with adjacent coils to provide motion horizontally and vertically in the page, respectively. These coils can be stacked separately or interleaved, as explained above. Hall effect sensors 382 can be mounted to the PCB inside individual coil loops to allow for monitoring of the motion of the magnets in the vessel carrier and to observe the health of coils by monitoring changes in magnetic field.

In some embodiments, motor control components 384 can be mounted on the underside of the PCB. This can present EMI challenges, so in some embodiments, motor control components 384 are mounted on a separate board for intersection PCB boards, like PCB 380. The Hall effect sensors are generally also mounted to the underside of PCBs so as to not interfere with the track surface.

Unlike other PCB coils the specific requirements of laboratory automation solutions results in very small payloads compared to existing solutions. For example, in a laboratory transport system there can be a maximum mover mass of 50 g, with maximum payload of 20 g moving at 0.5 m/s. The reduction of scale is what enables the PCB solution to be realized and optimized as outlined in this disclosure. These low force requirements of entities with respect to one another means the existing Halbach magnet array can be simplified into an omnidirectional dipole magnet. This means the directionality of the existing design is removed further simplifying the design space and costs required for the application.

While various illustrative embodiments incorporating the principles of the present teachings have been disclosed, the present teachings are not limited to the disclosed embodiments. Instead, this application is intended to cover any variations, uses, or adaptations of the present teachings and use its general principles. Further, this application is intended to cover such departures from the present disclosure that are within known or customary practice in the art to which these teachings pertain.

In the above detailed description, reference is made to the accompanying drawings, which form a part hereof In the drawings, similar symbols typically identify similar components, unless context dictates otherwise. The illustrative embodiments described in the present disclosure are not meant to be limiting. Other embodiments may be used, and other changes may be made, without departing from the spirit or scope of the subject matter presented herein. It will be readily understood that various features of the present disclosure, as generally described herein, and illustrated in the Figures, can be arranged, substituted, combined, separated, and designed in a wide variety of different configurations, all of which are explicitly contemplated herein.

Aspects of the present technical solutions are described herein with reference to flowchart illustrations and/or block diagrams of methods, apparatuses (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present technical solutions. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action can be said to be "in response to" a first action independent of whether the second action results directly or indirectly from the first action. The second action can occur at a substantially later time than the first action and still be in response to the first action. Similarly, the second action can be said to be in response to the first action even if intervening actions take place between the first action and the second action, and even if one or more of the intervening actions directly cause the second action to be performed. For example, a second action can be in response to a first action if the first action sets a flag and a third action later initiates the second action whenever the flag is set.

The present disclosure is not to be limited in terms of the particular embodiments described in this application, which are intended as illustrations of various features. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," et cetera). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera. As a non-limiting example, each range discussed herein can be readily broken down into a lower third, middle third and upper third, et cetera. As will also be understood by one skilled in the art all language such as "up to," "at least," and the like include the number recited and refer to ranges that can be subsequently broken down into subranges as discussed above. Finally, as will be understood by one skilled in the art, a range includes each individual member. Thus, for example, a group having 1-3 components refers to groups having 1, 2, or 3 components. Similarly, a group having 1-5 components refers to groups having 1, 2, 3, 4, or 5 components, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A printed circuit board (PCB) comprising:

a top face;

a plurality of alternating dielectric and conductive layers beneath the top face;

a plurality of multilayer conductive coils in the alternating dielectric and conductive layers, each coil comprising a plurality of spirals formed in a plurality of the conductive layers and an electrical connection between each adjacent spiral to form a stack of spirals, wherein each of the plurality of conductive coils comprises at least twelve single-layer spirals, and each spiral comprises at least twelve turns; and a first and second directional group of coils, each comprising a subset of the multilayer conductive coils, forming a first and second path of horizontally adjacent coils, respectively, each path providing a different direction of possible motion for a magnet motivated along the top face, wherein at least some of the multilayer conductive coils of the first and second directional group of coils overlap under the top surface, forming an intersection of the first and second paths.

2. The PCB of claim 1, wherein the plurality of multilayer conductive coils are configured to receive processor-controlled currents to create a moving magnetic field to selectively propel the magnet along the first and second path.

3. The PCB of claim 1, wherein the first and second paths are perpendicular at the intersection.

4. The PCB of claim 1, wherein the first path proceeds substantially straight through the intersection while the second path turns in an arc through the intersection.

5. The PCB of claim 1, wherein each of the plurality of multilayer conductive coils have a long axis and a short axis, and within each path an edge of each coil intersected by the short axis is substantially parallel with an edge of each adjacent coil along the path.

6. The PCB of claim 1, wherein the top face has a low-friction coating.

7. The PCB of claim 1, wherein the first and second directional group of coils overlap under the top surface by forming coils from the first group of coils using spirals on different layers than the spirals of the second group of coils such that the coils of the first group are between the top face and the coils of the second group.

8. The PCB of claim 1, wherein the first and second directional group of coils overlap under the top surface by forming coils from the first group of coils using spirals on different layers than the spirals of the second group of coils such that the spirals of the coils of the first group and the second group are interleaved.

9. A vessel transport system in a liquid handler system comprising:

one or more vessel movers configured to transport a sample vessel and having a magnetic base;

a track configured to provide a selective magnetic field to propel the magnetic base of each vessel mover along the track, the track comprising a plurality of multilayer printed circuit boards (PCB) arranged along a transport path, each PCB having a plurality of multi-layer conductive coils within layers of the PCB, each coil comprising a plurality of single-layer spirals electrically coupled with one another to form a multilayer coil, wherein each of the plurality of conductive coils comprises at least twelve single-layer spirals, and each spiral comprises at least twelve turns; and a processor configured to control selective application of currents to the plurality of multi-layer coils to create the selective magnetic field, wherein at least a subset of the plurality of multi-layer conductive coils are stacked relative to one another below a surface of the track, such that the selective application of currents selects one of a plurality of branching paths along the track.

10. The vessel transport system of claim 9, wherein each of the plurality of multi-layer conductive coils have a long axis and a short axis, and an edge of each coil intersected by the short axis is substantially parallel with an edge of each adjacent coil along the transport path.

11. The vessel transport system of claim 9, wherein the processor is configured to control selective application of the currents in accordance with a predetermined motion profile that sets at least one of maximum acceleration and maximum velocity to limit vessel spilling.

12. The vessel transport system of claim 9, wherein each PCB has a low-friction coating on a surface along which vessel movers travel.

13. The vessel transport system of claim 9, wherein each PCB has a plurality of Hall effect sensors mounted thereto that are configured to monitor motion of the magnetic vessel movers along the at least one continuous path.

14. The vessel transport system of claim 9, wherein at least a subset of the plurality of conductive coils are stacked within at least one of the PCBs such that the stacked conductive coils form an intersection in the at least one continuous path.

15. The vessel transport system of claim 9, wherein the subset of the plurality of multi-layer conductive coils are stacked relative to one another by forming the spirals of one coil on PCB layers above another coil.

16. The vessel transport system of claim 9, wherein the subset of the plurality of multi-layer conductive coils are stacked relative to one another by forming the spirals of one coil on PCB layers that are interleaved with another coil.

* * * * *